(12) United States Patent
Farmer et al.

(10) Patent No.: US 8,480,864 B2
(45) Date of Patent: Jul. 9, 2013

(54) COMPOSITIONS OF CORROSION-RESISTANT FE-BASED AMORPHOUS METALS SUITABLE FOR PRODUCING THERMAL SPRAY COATINGS

(76) Inventors: Joseph C. Farmer, Tracy, CA (US); Frank M. G. Wong, Livermore, CA (US); Jeffery J. Haslam, Livermore, CA (US); Xiaoyan (Jane) Ji, Pleasanton, CA (US); Sumner D. Day, Danville, CA (US); Craig A. Blue, Knoxville, TN (US); John D. K. Rivard, Arlington, VA (US); Louis F. Aprigliano, Berlin, MD (US); Leslie K. Kohler, Warren, NJ (US); Robert Bayles, Annandale, VA (US); Edward J. Lemieux, Summerland Key, FL (US); Nancy Yang, Lafayette, CA (US); John H. Perepezko, Madison, WI (US); Larry Kaufman, Brookline, MA (US); Arthur Heuer, Cleveland, OH (US); Enrique J. Lavernia, Davis, CA (US)

( * ) Notice: Subject to any disclaimer, the term of this patent is extended or adjusted under 35 U.S.C. 154(b) by 1013 days.

(21) Appl. No.: 11/595,166

(22) Filed: Nov. 9, 2006
(Under 37 CFR 1.47)

(65) Prior Publication Data
US 2010/0084052 A1   Apr. 8, 2010

Related U.S. Application Data

(60) Provisional application No. 60/737,029, filed on Nov. 14, 2005.

(51) Int. Cl.
*C23C 14/00* (2006.01)
*B05C 11/00* (2006.01)

(52) U.S. Cl.
USPC ............................ 204/298.13; 118/300

(58) Field of Classification Search
USPC ................. 420/15; 148/DIG. 158; 505/826
See application file for complete search history.

(56) References Cited

U.S. PATENT DOCUMENTS 4,296,178 A * 10/1981 Griesenauer et al. ......... 428/462
4,504,327 A *  3/1985 Inomata et al. ............... 148/304
(Continued)

FOREIGN PATENT DOCUMENTS

EP      585940 B1 *  3/1994
WO  WO 2005/024075 A2   3/2005

OTHER PUBLICATIONS

R.P. Frankenthal et al, "Long Term Atmospheric Oxidation of High Purity Iron", J. Electrochem. Soc.: Electrochemical Science and Technology, vol. 132, No. 5, p. 1019 (May 1985).*

(Continued)

*Primary Examiner* — Dah-Wei Yuan
*Assistant Examiner* — Charles Capozzi
(74) *Attorney, Agent, or Firm* — Eddie E. Scott

(57) ABSTRACT

A method of coating a surface comprising providing a source of amorphous metal that contains manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron; and applying said amorphous metal to the surface by a spray.

2 Claims, 21 Drawing Sheets

U.S. PATENT DOCUMENTS

| | | | |
|---|---|---|---|
| 4,563,400 A * | 1/1986 | Criss et al. | 428/630 |
| 4,865,710 A * | 9/1989 | Aaron et al. | 204/298.2 |
| 4,880,482 A | 11/1989 | Hashimoto et al. | |
| 5,486,240 A | 1/1996 | McCallum et al. | |
| 5,626,691 A | 5/1997 | Li et al. | |
| 5,690,889 A | 11/1997 | McCallum et al. | |
| 5,803,992 A | 9/1998 | McCallum et al. | |
| 6,080,284 A * | 6/2000 | Miyaura | 204/192.12 |
| 6,125,912 A | 10/2000 | Branagan et al. | |
| 6,258,185 B1 | 7/2001 | Branagan et al. | |
| 6,261,386 B1 | 7/2001 | Perepezko et al. | |
| 6,562,156 B2 | 5/2003 | Liu | |
| 6,767,419 B1 | 7/2004 | Branagan | |
| 2003/0051781 A1 | 3/2003 | Branagan | |
| 2003/0164209 A1 | 9/2003 | Poon et al. | |
| 2004/0140017 A1 | 7/2004 | Branagan | |
| 2004/0140021 A1 | 7/2004 | Branagan | |
| 2004/0202797 A1 * | 10/2004 | Ginder et al. | 427/598 |
| 2004/0250926 A1 | 12/2004 | Branagan | |
| 2004/0250929 A1 | 12/2004 | Branagan | |
| 2004/0253381 A1 | 12/2004 | Branagan | |
| 2005/0013723 A1 | 1/2005 | Branagan | |
| 2005/0084421 A1 | 4/2005 | Unger et al. | |
| 2005/0129581 A1 | 6/2005 | McBride et al. | |
| 2005/0208218 A1 * | 9/2005 | Becker et al. | 427/248.1 |
| 2005/0252773 A1 | 11/2005 | McBride et al. | |

OTHER PUBLICATIONS

Farmer JC et al: "Corrosion characterization of iron-based high-performance amorphous-metal thermal-spray coatings".
PVP-American Society of Mechanical Engineers. Pressure Vesselsand Piping Division, American Sociate of Mechanical Engineers, New York, NY, US.
vol. 7, Jul. 17, 2005, pp. 583-589, XP0090067 ISSN: 0277-027X p. 584, col. 2, paragraph 3.
Patil, U., et al, "An unusual phase tranformation during mechanical alloying of an Fe-bsed bulk metallic glass composition," Journal of Alloys and Compounds 389 (2005) 121-126.
Wang, W.H., et al., "Enhancement of the soft magnetic properties of FeCoZrMoWB bulk metallic glass by microalloying," J. Phys.: Conden. Matter 16 (2004) 3719-3723.
Shen, J., et al, "Exceptionally high glass-forming ability of an FeCoCrMoCBY alloy," Applied Physics Letters 86, (2005) 151907-1-3.
Chen, Q.J., et al., "Glass-Forming Ability of an Iron-Based Alloy Enhanced by Co Addition and Evaluated by a New Criterion," Chin. Phys.Lett., vol. 22, No. 7 (2005) 1736-1738.
Lin, C.Y., et al., "Soft magnetic ternary iron-boron-based bulk metallic glasses," Applied Physics Letters 86, (2005), 162501-1-3.
Hu, Y., et al., "Synthesis of Fe-based bulk metallic glasses with low purity materials by multi-metalloids addition," Materials Letters 57, (2003), 2698-2701.

* cited by examiner

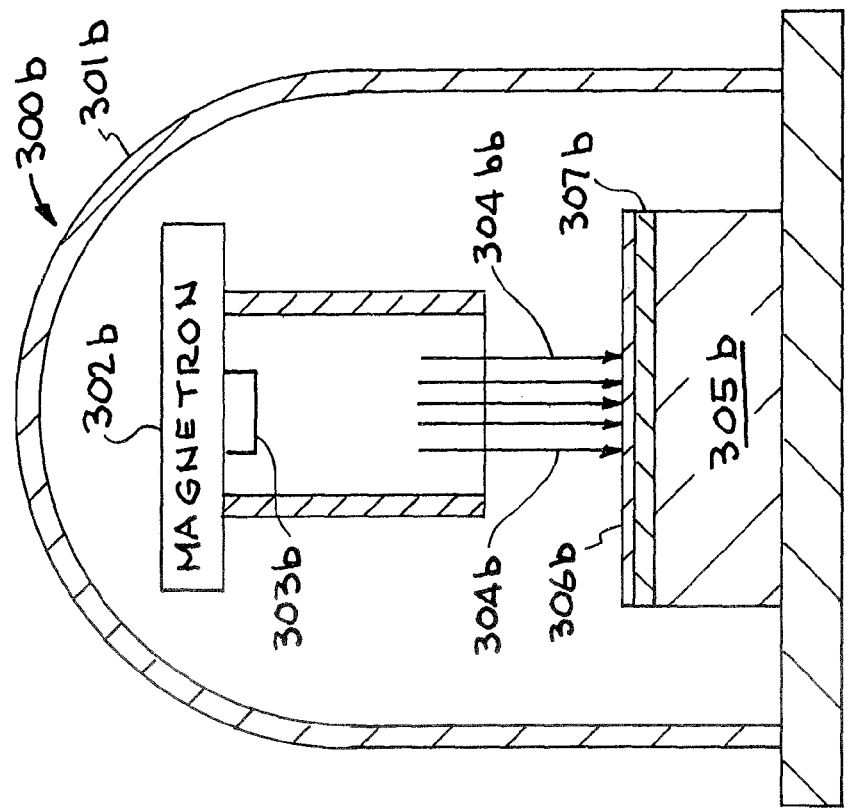
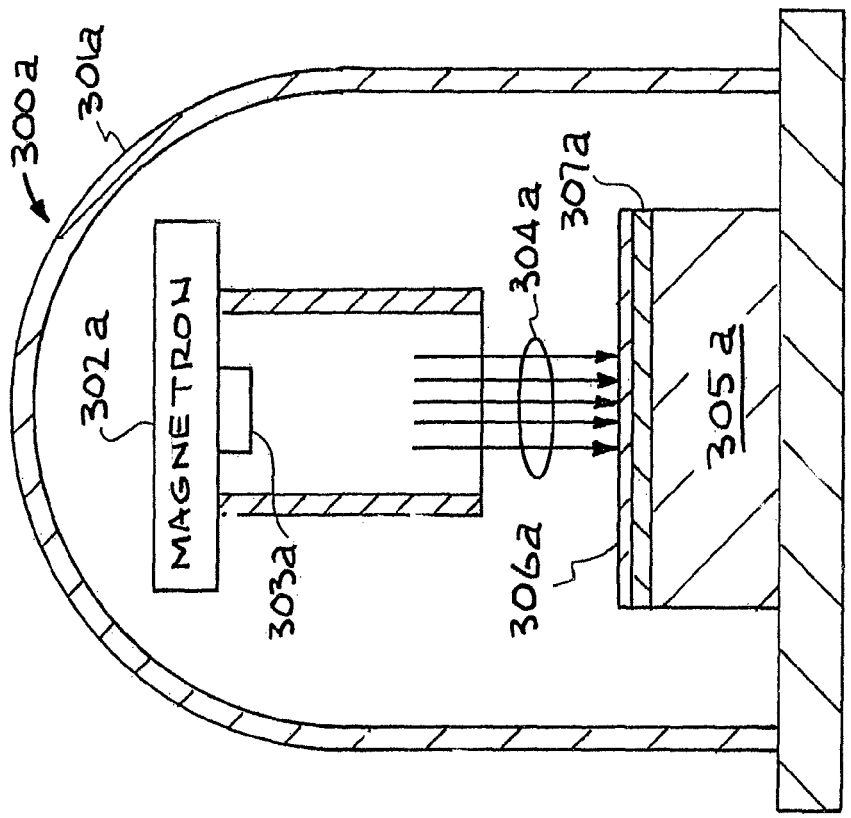

COMPOSITIONS OF CORROSION-RESISTANT FE-BASED AMORPHOUS METALS SUITABLE FOR PRODUCING THERMAL SPRAY COATINGS

CROSS-REFERENCE TO RELATED APPLICATIONS

This application claims the benefit of U.S. Provisional Patent Application No. 60/737,029 filed Nov. 14, 2005 and titled "High-Performance Corrosion Resistant Material: New Compositions of Corrosion-Resistant Fe-Based Amorphous Metals Suitable for Producing Thermal Spray Coatings." U.S. Provisional Patent Application No. 60/737,029 filed Nov. 14, 2005 and titled "High-Performance Corrosion Resistant Material: New Compositions of Corrosion-Resistant Fe-Based Amorphous Metals Suitable for Producing Thermal Spray Coatings" is incorporated herein by this reference.

The United States Government has rights in this invention pursuant to Contract No. W-7405-ENG-48 between the United States Department of Energy and the University of California for the operation of Lawrence Livermore National Laboratory.

BACKGROUND

1. Field of Endeavor

The present invention relates to corrosion and more particularly to corrosion resistant material.

2. State of Technology

U.S. Pat. No. 6,258,185 issued Jul. 10, 2001 to Daniel Branagan and Joseph V. Burch for methods of forming steel provides the following state of technology information:

"4. A method of forming a steel, comprising: forming a molten alloy; cooling the alloy at a rate which forms a metallic glass; devitrifying the metallic glass to convert the glass to a crystalline steel material having a nanocrystalline scale grain size; and transforming a portion of the crystalline steel material to metallic glass.

8. The method of claim 4 wherein the molten alloy comprises: at least 50% Fe; at least one element selected from the group consisting of Ti, Zr, HF, V, Nb, Ta, Cr, Mo, W, Al, La, Ce, Pr, Nd, Sm, Eu, Gd, Tb, Dy, Ho, Er, Tm, Yb, and Lu; and at least one element selected from the group consisting of B, C, N, O, P and S.

9. The method of claim 4 wherein the molten alloy comprises a material selected from the group consisting of $Fe_{69} Zr_3 Mo_7 P_{16} C_3 Si_2$, $Fe_{71} Ti_3 Cr_7 B_{14} C_3 Si_2$, $Fe_{68} Cr_4 Mo_7 P_{12} B_6 C_3$, DNA3, DNS2C, and DNA6.

14. A method of forming a steel, comprising: providing a first metallic glass steel substrate; forming a molten alloy over the first metallic glass steel substrate to heat and devitrify at least some of the underlying metallic glass of the steel substrate.

18. The method of claim 14 wherein the molten alloy comprises a material selected from the group consisting of $Fe_{69} Zr_3 Mo_7 P_{16} C_3 Si_2$, $Fe_{71} Ti_3 Cr_7 B_{14} C_3 Si_2$, $Fe_{68} Cr_4 Mo_7 P_{12} B_6 C_3$, DNA3, DNS2C and DNA6.

19. The method of claim 14 wherein the first metallic glass substrate comprises a material selected from the group consisting of $Fe_{69} Zr_3 Mo_7 P_{16} C_3 Si_2$, $Fe_{71} Ti_3 Cr_7 B_{14} C_3 Si_2$, $Fe_{68} Cr_4 Mo_7 P_{12} B_6 C_3$, DNA3, DNS2C and DNA6." (Claims 4, 8, 9, 14, 18, and 19)

U.S. Pat. No. 6,767,419 issued Jul. 27, 2004 to Daniel Branagan for methods of forming hardened surfaces provides the following state of technology information: "A method of forming a hardened surface on a substrate, comprising: providing a substrate; forming a molten alloy and cooling said alloy to form a metallic glass coating on the substrate; the forming comprising a successive build-up of metallic glass layers, the metallic glass comprising one or more materials selected from the group consisting of $(Fe_{0.85} Cr_{0.15})_{83} B_{17}$, $(Fe_{0.8} Cr_{0.2})_{83} B_{17}$, $(Fe_{0.75} Cr_{0.25})_{83} B_{17}$, $(Fe_{0.6} Co_{0.2} Cr_{0.2})83 B17$, $(Fe_{0.8} Cr_{0.15} Mo_{0.05})_{83} B_{17}$, $(Fe_{0.8} Cr_{0.2})_{79} B_{17} C_4$, $(Fe_{0.8} Cr_{0.2})_{79} B_{17} Si_4$, $(Fe_{0.8} Cr_{0.2})_{79} B_{17} Al_4$, $(Fe_{0.8} Cr_{0.2})_{75} B_{17} Al_4 C_4$, $(Fe_{0.8} Cr_{0.2})_{75} B_{17} Si_4 C_4$, $(Fe_{0.8} Cr_{0.2})_{75} B_{17} Si_4 Al_4$, $(Fe_{0.8} Cr_{0.2})_{71} B_{17} Si_4 C_4 Al_4$, $(Fe_{0.7} Co_{0.1} Cr_{0.2})_{83} B_{17}$, $(Fe_{0.8} Cr_{0.2})_{80} B_{20}$, $(Fe_{0.8} Cr_{0.2})_{76} B_{17} Al_7$, $(Fe_{0.8} Cr_{0.2})_{79} B_{17} W_2 C_2$, $(Fe_{0.8} Cr_{0.2})_{81} B_{17} W_2$, and $Fe 64 Ti 3 Cr 5 Mo_2 B_{16} C_5 Si_1 Al_2 La_2$; the metallic glass coating having a hardness of at least about 9.2 GPa and converting at least a portion of the metallic glass coating to a crystalline material having a nanocrystalline grain size." (Claim 13)

United States Patent Application No. 2003/0051781 by Daniel J. Branagan for hard metallic materials, hard metallic coatings, methods of processing metallic materials and methods of producing metallic coatings, published Mar. 20, 2003 provides the following state of technology information: "Both microcrystalline grain internal structures and metallic glass internal structures can have properties which are desirable in particular applications for steel. In some applications, the amorphous character of metallic glass can provide desired properties. For instance, some glasses can have exceptionally high strength and hardness. In other applications, the particular properties of microcrystalline grain structures are preferred. Frequently, if the properties of a grain structure are preferred, such properties will be improved by decreasing the grain size. For instance, desired properties of microcrystalline grains (i.e., grains having a size on the order of $10^{-6}$ meters) can frequently be improved by reducing the grain size to that of nanocrystalline grains (i.e., grains having a size on the order of $10^{-9}$ meters). It is generally more problematic, and not generally possible utilizing conventional approaches, to form grains of nanocrystalline grain size than it is to form grains of microcrystalline grain size."

United States Patent Application No. 2005/0013723 for formation of metallic thermal barrier alloys by Daniel James Branagan published Jan. 20, 2005 provides the following state of technology information: "Metals and metallic alloys have metallic bonds consisting of metal ion cores surrounded by a sea of electrons. These free electrons which arise from an unfilled outer energy band allow the metal to have high electrical and thermal conductivity which makes this class of materials conductors. Due to the nature of the metallic bonds, metals and metallic alloys may exhibit a characteristic range of properties such as electrical and thermal conductivity. Typical metallic materials may exhibit values of electrical resistivity that generally fall in a range of between about 1.5 to $145\ 10^{-8}$ Ωm, with iron having an electrical resistivity of about $8.6\ 10^{-8}$ Ωm. Typical values of thermal conductivity for metallic materials may be in a range of between about 0.2 to 4.3 watts/cm° C., with iron exhibiting a thermal conductivity of about 0.8 watts/cm° C. (Paragraph [0003]) By contrast, ceramics are a class of materials which typically contain positive ions and negative ions resulting from electron transfer from a cation atom to an anion atom. All of the electron density in ceramics is strongly bonded resulting in a filled outer energy band. Ceramic alloys, due to the nature of their ionic bonding, will exhibit a different characteristic range of properties such as electrical and thermal conductivity. Because of the lack of free electrons, ceramics generally have poor electrical and thermal conductivity and are considered insulators. Thus, ceramics may be suitable for use in applications such as thermal barrier coatings while metals are not.

(Paragraph [0004]) Designing a metal alloy to exhibit ceramic like electrical and thermal conductivities is unique. The only area where this has been utilized in material science is in the design of soft magnetic materials for transformer core applications. In such applications, extra silicon is added to iron in order to specifically reduce the electrical conductivity to minimize eddy current losses. However, iron-silicon alloys utilized for transformer cores typically contain a maximum of 2.5 at % (atomic percent) silicon because any additional silicon embrittles the alloy. Additionally, attempts to reduce electrical conductivity of iron transformer cores have not addressed reduced thermal conductivity." (Paragraph [0005])

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a method of coating a surface comprising providing a source of amorphous metal that contains manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron; and applying said amorphous metal to the surface by a spray. In other embodiments the specific ranges are the following: manganese (1.5 to 2.9 atomic %), yttrium (0.1 to 7 atomic %), and silicon (0.3 to 3.1 atomic %) in the range of composition given in parentheses; and that contains the following elements in the specified range of composition given in parentheses: chromium (14.6 to 19.2 atomic %), molybdenum (2.3 to 14 atomic %), tungsten (1.4 to 3 atomic %), boron (5.9 to 16 atomic %), carbon (3.7 to 15 atomic %), and (iron 41-76 atomic %). The present invention also provides a coating made of the amorphous metal. Table 1 below provides additional information.

TABLE 1

Ranges of Composition

| Element | Ranges Based on HPCRM Research | SAM40 | SAM2X5 | SAM1651 |
|---|---|---|---|---|
| | Atomic Percent (at. %) | | | |
| Fe | 43-59 | 52.3 | 49.7 | 48.0 |
| Ni | 1-7 | | | |
| Co | | | | |
| Mn | 1-2 | 2.0 | 1.9 | |
| Cr | 14-22 | 19.0 | 18.1 | 15.0 |
| Mo | 2-16 | 2.5 | 7.4 | 14.0 |
| W | 1-3 | 1.7 | 1.6 | |
| B | 5-17 | 16.0 | 15.2 | 6.0 |
| C | 3-15 | 4.0 | 3.8 | 15.0 |
| P | | 10 | | |
| Si | 1-5 | 2.5 | 2.4 | |
| Al | | | | |

TABLE 1-continued

Ranges of Composition

| Element | Ranges Based on HPCRM Research | SAM40 | SAM2X5 | SAM1651 |
|---|---|---|---|---|
| Zr | 1-7 | | | |
| Ti | 1-7 | | | |
| Nb | | | | |
| Ta | | | | |
| Y | 1-7 | | | 2.0 |
| Er | | | | |

The present invention has use as a coating for naval ships and submarines; containers for shipment, storage and disposal of spent nuclear fuel; pressurized water and boiling water nuclear reactors; breeder reactors with liquid metal coolant; nuclear power systems; fossil energy power plants; chemical plants; bridges; structures; and marine applications, and other applications.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

FIGS. 3A and 3B illustrate additional embodiments of systems of the present invention.

DETAILED DESCRIPTION OF THE INVENTION

Figure 1:
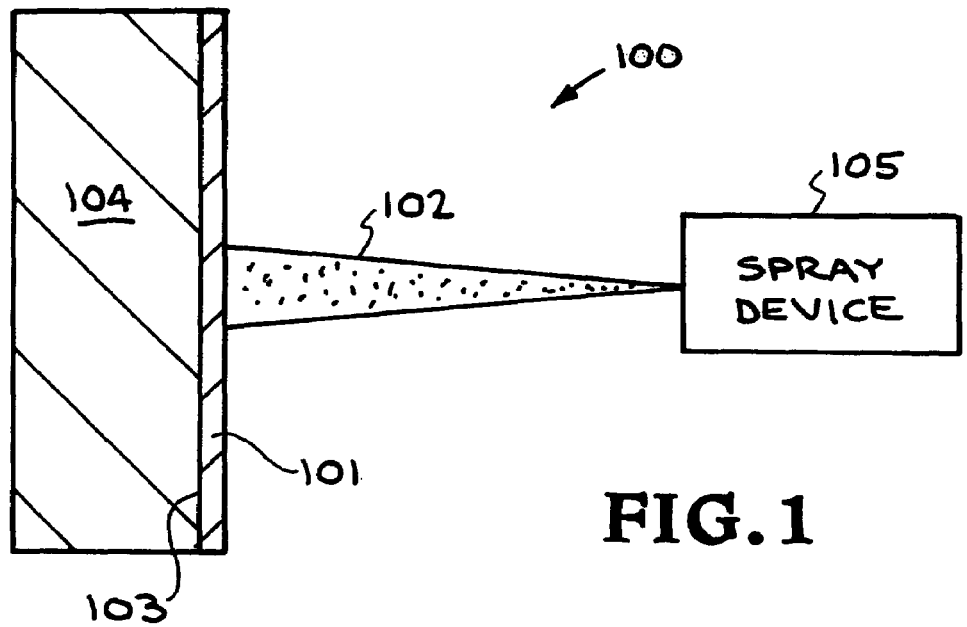
FIG. 1 illustrates one embodiment of a system of the present invention.

Referring to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

The present invention provides a coating comprising a composite material made of amorphous metal that contains the following elements in the specified range of composition given in parentheses: manganese (1 to 3 atomic %), yttrium (0.1 to 10 atomic %), silicon (0.3 to 3.1 atomic %), chromium (15 to 20 atomic %), molybdenum (2 to 15 atomic %), tungsten (1 to 3 atomic %), boron (5 to 16 atomic %), carbon (3 to 16 atomic %), and the balance iron. The present invention also provides a system for forming a coating comprising using a spray process to deposit the amorphous metal. The present invention utilizes combinatorial synthesis methodology based upon the marriage of statistical optimization approaches with computational thermodynamics and phase transformation kinetics. The present invention also provides coating processes that use cold-spray methodology to deposit mechanically hard, corrosion-resistant amorphous metals, using a softer corrosion-resistant metal or binder to enable this low-temperature coating process. Coating processes for the deposition phosphorous-containing iron-based amorphous-metal coatings that rely on cold-spray methodology to overcome problems associated with the thermal-spray of phosphorous containing materials (including the possible generation of volatile, organo-phosphorous compounds). The present invention provides a method of coating a surface comprising providing a source of amorphous metal that contains manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron; and applying said amorphous metal to the surface by a spray.

Background information relating to the present invention is described in the following publications: (1) United States Patent Application No. 2003/0051781 by Daniel J. Branagan for hard metallic materials, hard metallic coatings, methods of processing metallic materials and methods of producing metallic coatings, published Mar. 20, 2003; (2) U.S. Pat. No. 6,767,419 issued Jul. 27, 2004 to Daniel Branagan for methods of forming hardened surfaces provides the following state of technology information, and (3) United States Patent Application No. 2005/0013723 for formation of metallic thermal barrier alloys by Daniel James Branagan published Jan. 20, 2005. United States Patent Application No. 2003/0051781 by Daniel J. Branagan for hard metallic materials, hard metallic coatings, methods of processing metallic materials and methods of producing metallic coatings, published Mar. 20, 2003; U.S. Pat. No. 6,767,419 issued Jul. 27, 2004 to Daniel Branagan for methods of forming hardened surfaces provides the following state of technology information, and United States Patent Application No. 2005/0013723 for formation of metallic thermal barrier alloys by Daniel James Branagan published Jan. 20, 2005 are incorporated herein by reference.

Referring now to the drawings and in particular to FIG. 1, one embodiment of a system of the present invention is illustrated. This embodiment is designated generally by the reference numeral 100. The embodiment 100 provides a corrosion resistant amorphous metal coating 101. The corrosion resistant amorphous metal coating 101 is produced by spray processing to form a coating made of amorphous metal. As illustrated in FIG. 1, a corrosion-resistant amorphous-metal 102 is sprayed to form the coating 101. The coating 101 is applied to the surface 103 of a structure 104. The coating 101 is applied to the surface 103 by the spray 102 using a spray device 105. The coating 101 comprising a composite material made of amorphous metal that contains the following elements in the specified range of composition given in parentheses: manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron.

The present invention has many uses. For example, the present invention can be used for metal-ceramic armor; projectiles; gun barrels, tank loader trays, rail guns, non-magnetic hulls, hatches, seals, propellers, rudders, planes, ships, submarine oil and water drilling equipment; earth moving equipment; tunnel-boring machinery; pump impellers & shafts; containers for shipment, storage and disposal of spent nuclear fuel; pressurized and boiling water nuclear reactors; breeder reactors with liquid metal coolant, and other uses. Such materials could also be used to coat the entire outer surface of containers for the transportation and long-term storage of high-level radioactive waste (HLW) spent nuclear fuel (SNF), or to protect welds and heat affected zones, thereby preventing exposure to environments that might cause stress corrosion cracking. In the future, it may be possible to substitute such high-performance iron-based materials for more-expensive nickel-based alloys, thereby enabling cost savings in various industrial applications.

Figure 2:
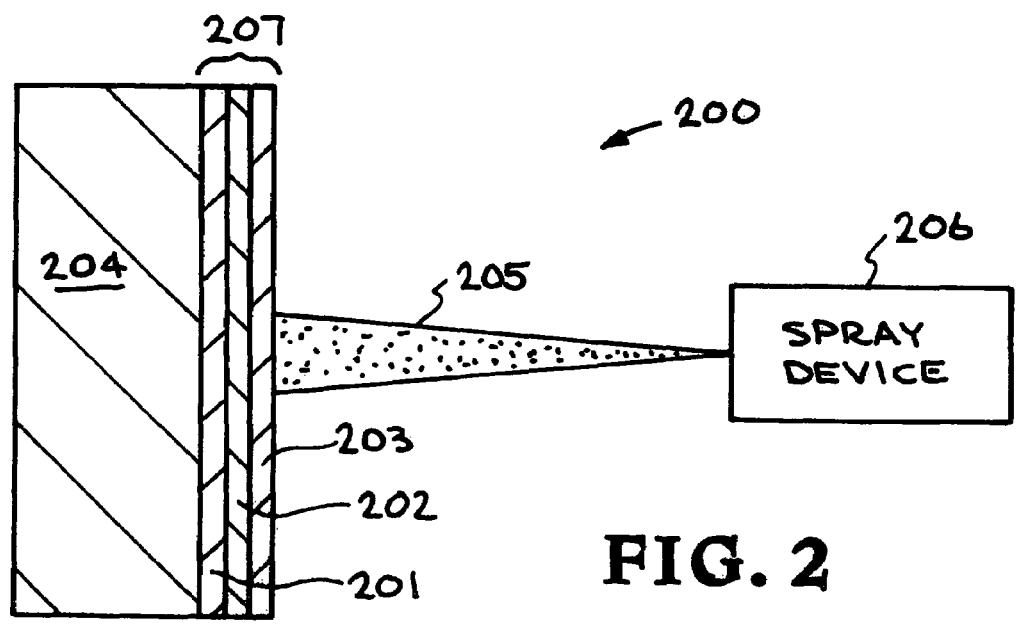
FIG. 2 illustrates another embodiment of a system of the present invention.

Referring now to FIG. 2, another embodiment of a system of the present invention is illustrated. This embodiment is designated generally by the reference numeral 200. The embodiment 200 provides a corrosion resistant amorphous metal coating 207. The corrosion resistant amorphous metal coating 207 is produced by spray processing to form a composite coating made of amorphous metal. As illustrated in FIG. 2, the alternating layers 201, 202, 203, etc. of coating 207 are applied to a structure 204. A spray device 206 produces the spray 205.

As illustrated in FIG. 2, a corrosion-resistant amorphous-metal is sprayed to form the coating 207 containing a multiplicity of layers 201, 202, 203, etc. Each of the coating layers 201, 202, 203 is made of advanced formulations of corrosion-resistant amorphous-metals. For example the coating layer 201 comprises a composite material made of amorphous metal that contains the following elements in the specified range of composition given in parentheses: manganese (1 to 3 atomic %), yttrium (0.1 to 10 atomic %), silicon (0.3 to 3.1 atomic %), chromium (15 to 20 atomic %), molybdenum (2 to 15 atomic %), tungsten (1 to 3 atomic %), boron (5 to 16 atomic %), carbon (3 to 16 atomic %), and the balance iron.

The present invention has many uses. For example, the present invention can be used for metal-ceramic armor; projectiles; gun barrels, tank loader trays, rail guns, non-magnetic hulls, hatches, seals, propellers, rudders, planes, ships, submarine oil and water drilling equipment; earth moving equipment; tunnel-boring machinery; pump impellers & shafts; containers for shipment, storage and disposal of spent nuclear fuel; pressurized and boiling water nuclear reactors; breeder reactors with liquid metal coolant, and other uses. Such materials could also be used to coat the entire outer surface of containers for the transportation and long-term storage of high-level radioactive waste (HLW) spent nuclear fuel (SNF), or to protect welds and heat affected zones, thereby preventing exposure to environments that might cause stress corrosion cracking. In the future, it may be possible to substitute such high-performance iron-based materials for more-expensive nickel-based alloys, thereby enabling cost savings in various industrial applications.

Referring now to FIG. 3A, another embodiment of a system of the present invention is illustrated. This embodiment is designated generally by the reference numeral 300a. A deposition chamber 301a contains a deposition system including magnetron 302a and sputter target 303a. The magnetron 302a and sputter target 303a produce deposition spray 304a. The deposition spray is directed onto the surface of the structure 305a that is to be coated. The deposition spray 304a forms the layers 306a and 307a on structure 305a. Each of the coating layers 306a and 307a are made of advanced formulations of corrosion-resistant amorphous-metals. For example the coating layers 306a and 307a each comprises a composite material made of amorphous metal that contains the following elements in the specified range of composition given in parentheses: manganese (1 to 3 atomic %), yttrium (0.1 to 10 atomic %), silicon (0.3 to 3.1 atomic %), chromium (15 to 20 atomic %), molybdenum (2 to 15 atomic %), tungsten (1 to 3 atomic %), boron (5 to 16 atomic %), carbon (3 to 16 atomic %), and the balance iron.

The structure 305a can be an element of a plane, a ship, a submarine, oil and water drilling equipment, earth moving equipment, tunnel-boring machinery, or other equipment. The element coated b the system 300 can be used for metal armor, projectiles, gun barrels, tank loader trays, rail guns, non-magnetic hulls, hatches, seals, propellers, rudders, pump impellers and shafts, containers for stent nuclear fuel, pressurized water reactors, boiling water reactors, breeder reactors with liquid metal coolant, and other uses. The element coated by the system 300 can be used for containers for the transportation and long-term storage of high-level radioactive waste (HLW) spent nuclear fuel (SNF), or to protect welds and heat affected zones, thereby preventing exposure to environments that might cause stress corrosion cracking. Another use of the coating 308 is to substitute it for more-expensive nickel-based alloys, thereby enabling cost savings in various industrial applications.

Referring to FIG. 3B another embodiment of a system of the present invention is illustrated. This embodiment is designated generally by the reference numeral 300b. A deposition chamber 301b contains a deposition system including magnetron 302b and sputter target 303b. The magnetron 302b and sputter target 303b produce deposition sprays 304b and 304bb. The deposition spray 304bb and deposition spray 304b are sources of amorphous metal that produce the coating layers 306b and 307b on the structure 305b. For example, the source of the deposition spray 304bb and the source of the deposition spray 304b can be a source of amorphous metal that contains manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron. The magnetron 302b and sputter target 303b produce the deposition spray 304bb and deposition spray 304b and are state of technology units for producing deposition sprays.

The deposition spray 304bb and the deposition spray 304b are a source of amorphous metal that contains amorphous metal that comprises a composite material made of amorphous metal that contains manganese (1.5 to 2.9 atomic %), yttrium (0.1 to 7 atomic %), and silicon (0.3 to 3.1 atomic %) in the range of composition given in parentheses; and that contains the following elements in the specified range of composition given in parentheses: chromium (14.6 to 19.2 atomic %), molybdenum (2.3 to 14 atomic %), tungsten (1.4 to 3 atomic %), boron (5.9 to 16 atomic %), carbon (3.7 to 15 atomic %), and (iron 41-76 atomic %).

New elemental compositions are being developed and tested for corrosion and wear resistant amorphous metals, along with composites that incorporate these and other similar amorphous metals, and layered and graded coatings with amorphous metals and ceramics. These and other amorphous metal coatings can be produced as graded coatings, where the coating gradually transitions from the metallic substrate material that is being protected by the coating, to a pure amorphous metal coating, or to a amorphous metal multilayer coating, and eventually to an outer layer, which provides extreme corrosion and wear resistance. The grading can be accomplished by gradually shifting from one amorphous metal powder to another amorphous powder during the deposition operations.

Applicants are developing and testing the advanced formulations of Fe-based corrosion-resistant amorphous-metals that comprise a composite material made of amorphous metal that contains the following elements in the specified range of composition given in parentheses: manganese (1.5 to 2.9 atomic %), yttrium (0.1 to 7 atomic %), and silicon (0.3 to 3.1 atomic %) in the range of composition given in parentheses; and that contains the following elements in the specified range of composition given in parentheses: chromium (14.6 to 19.2 atomic %), molybdenum (2.3 to 14 atomic %), tungsten (1.4 to 3 atomic %), boron (5.9 to 16 atomic %), carbon (3.7 to 15 atomic %), and (iron 41-76 atomic %).

These materials have lower critical cooling rates, and are therefore more easily deposited in a glassy state, and have optimized elemental compositions that exhibit much more stable passive film stability. To avoid the experimental difficulties encountered with the early thermal-spray coatings, these new materials were made into fully dense, pore-free samples with melt spinning. These new formulations, in the form of melt-spun ribbons and ingots, were tested in a salt fog chamber for 24 cycles. Melt-spun ribbons of Alloy C-22 and Type 316L stainless steel were used as reference samples. In stark contrast to the early thermal spray coatings of SAM40 (DAR40) and SAM40X3, none of these new "LDAR-series" ribbon samples exhibited any signs of corrosive attack.

These advanced formulations can be produced as either bulk alloys or coatings. For example, melt spinning and arc melting with drop casting can be used to render these materials as fully dense pore-free bulk alloys. Coatings can be produced with advanced thermal spray processes, or by physical vapor deposition processes such as magnetron sputtering or electron-beam evaporation. The materials can also be rendered as bulk alloys by using HVOF to form large plates on a flat mandrel. Near theoretical density is achieved through precise control of powder size with atomization and classification.

X-Ray Diffraction of Drop-Cast Ingots

Figure 4:
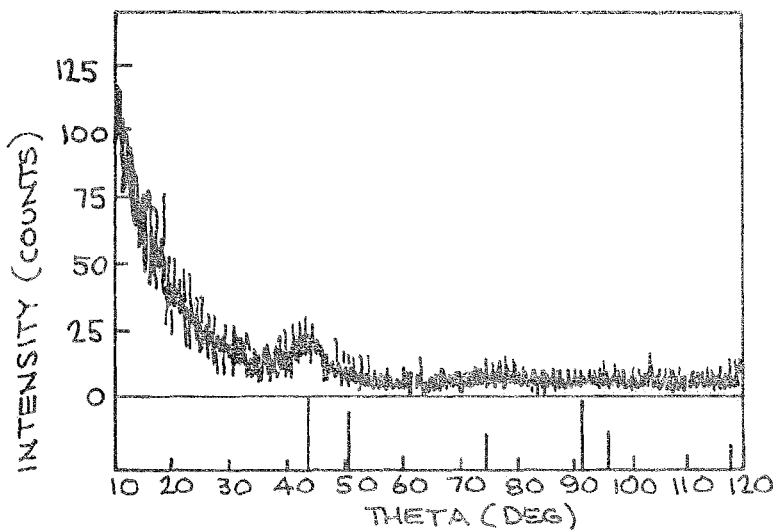
FIG. 4 shows X-ray diffraction pattern for drop-cast ingot of SAM1651 (LDAR7 OR CBCTL1651), that shows virtually no crystalline structure. Peak broadening of all three HVOF coatings suggest presence of some fine crystalline phase(s) in the amorphous matrix.

In addition to the melt-spinning process, arc-melted drop-cast ingots of a wide variety of Fe-based amorphous metals were synthesized for corrosion testing by ORNL. These ingots were cast into cylindrical molds, thus forming long rods with a nominal diameter of 2-3 millimeters. It has been learned that additions of 2-3 atomic percent yttrium or zirconium can enhance the glass-forming ability (GFA), and substantially lower the required critical cooling rate (CCR). Such formulations are relatively easily cast as large-diameter (several millimeters) rods. The X-ray diffraction (XRD) pattern for drop-cast ingot of SAM1651, one version of this material, shows virtually no crystalline structure. This is illustrated in FIG. 4. FIG. 4 shows an X-ray diffraction pattern for drop-cast ingot of SAM1651 (LDAR7 OR CBCTL1651), shows virtually no crystalline structure. Peak broadening of all three HVOF coatings suggest presence of some fine crystalline phase(s) in the amorphous matrix. Peak broadening of all three HVOF coatings suggest presence of some fine crystalline phases in the amorphous matrix.

Figure 5A:
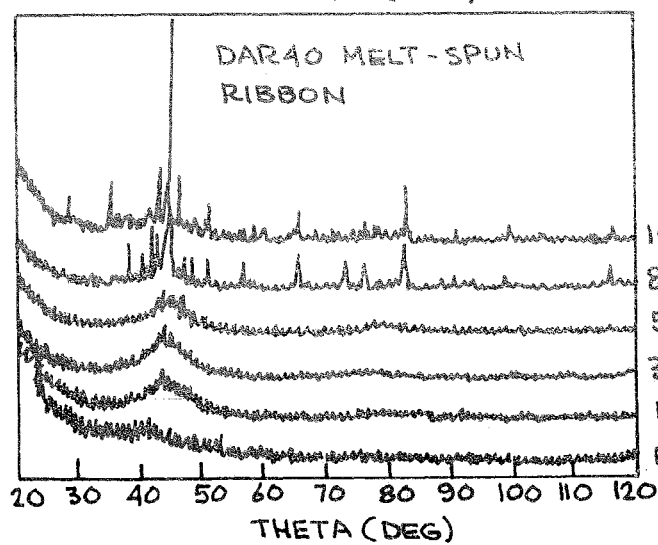
FIGS. 5A and 5B illustrate X-ray diffraction (XRD) that shows that the matrices of melt-spun ribbons of SAM40 (DAR40) parent material and drop-cast ingots of SAM1651 (LDAR7 OR CBCTL1651) remain amorphous to 500° C. However, XRD is not effective for detecting dispersed crystalline phase(s) that account for less than 2 volume % of the material. Electron microscopy was used to compensate for this shortcoming.
Figure 5B:
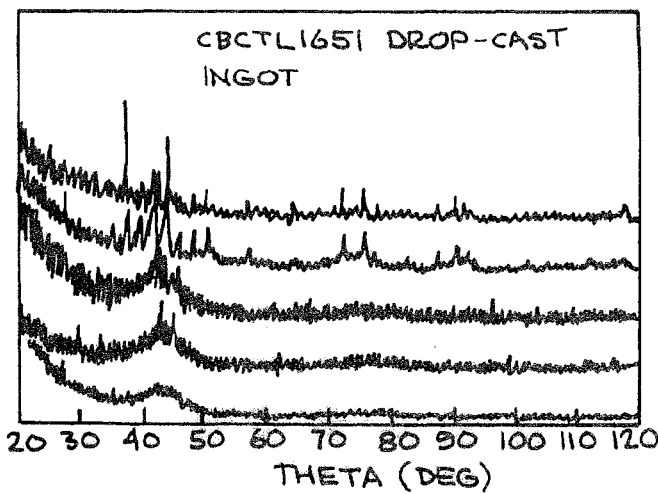

X-ray diffraction (XRD) was used to show that the matrices of melt-spun ribbons of SAM40 (DAR40) and drop-cast ingots of SAM1651 remain amorphous to 500° C., as shown in FIGS. 5A and 5B. However, XRD is not effective for detecting dispersed crystalline phase(s) that account for less than 2 volume % of the material. The X-ray diffraction (XRD) of FIGS. 5A and 5B shows that the matrices of melt-spun ribbons of SAM40 (DAR40) parent material and drop-cast ingots of SAM1651 (LDAR7 OR CBCTL1651) remain amorphous to 500° C. However, XRD is not effective for detecting dispersed crystalline phase(s) that account for less than 2 volume % of the material. Electron microscopy was used to compensate for this shortcoming.

Pore-Free Amorphous Coatings by Careful Control of Powder Size

Early high-velocity oxy-fuel (HVOF) coatings were found to have too much porosity and residual crystalline structure for targeted DOD and DOE applications. Therefore, a systematic study was undertaken to modify and optimize the HVOF process so that fully dense, pore-free coatings could be produced. This optimization was successful.

Figure 6:
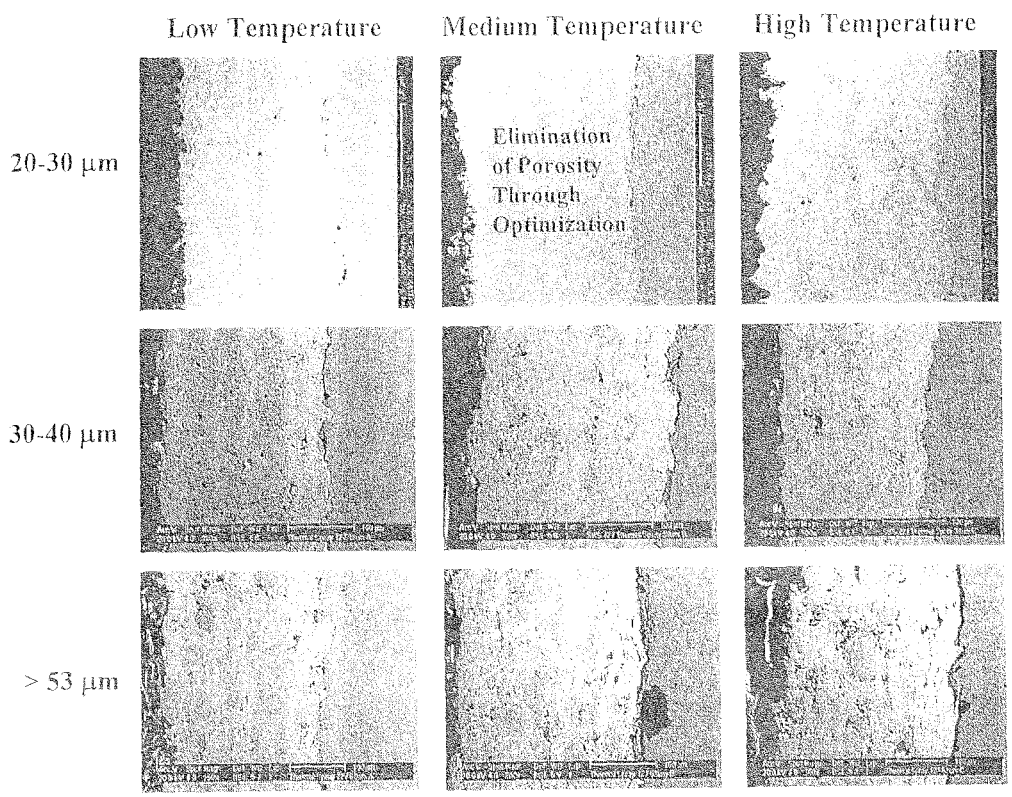
FIG. 6 shows a parametric study of the HVOF process was conducted with SAM40 (DAR40), with the mean particle size of the sprayed powder and the substrate temperature systematically varied. While coatings produced with relatively large particles (>54 μm) showed un-melted and un-consolidated particles embedded in the coating, with substantial porosity and poor interfacial bonding, coatings produced with smaller particles (20 to 23 μm) are essentially homogeneous, pore-free and well-bonded.

A parametric study of the HVOF process was conducted with SAM40 (DAR40), with the mean particle size of the sprayed powder and the substrate temperature systematically varied, and is illustrated in FIG. 6. While coatings produced with relatively large particles (≦54 μm) showed un-melted and un-consolidated particles embedded in the coating, with substantial porosity and poor interfacial bonding, coatings produced with smaller particles (20 to 23 μm) are essentially homogeneous, pore-free and well-bonded. FIG. 6 shows a parametric study of the HVOF process conducted with SAM40 (DAR40), with the mean particle size of the sprayed powder and the substrate temperature systematically varied. While coatings produced with relatively large particles (>54 μm) showed un-melted and un-consolidated particles embedded in the coating, with substantial porosity and poor interfacial bonding, coatings produced with smaller particles (20 to 23 μm) are essentially homogeneous, pore-free and well-bonded.

Figure 7A:
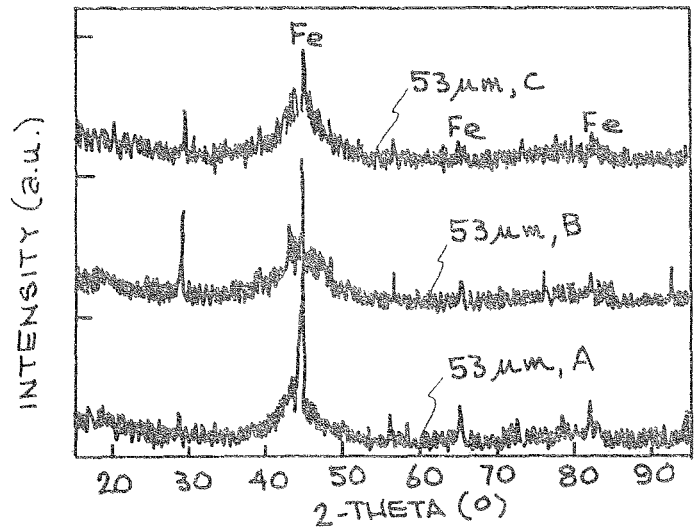
FIGS. 7A, 7B, and 7C illustrates an X-ray diffraction SAM40 (DAR40) deposited with HVOF during a parametric study that shows the coatings produced with smaller particles (25 μm) are more glassy, with fewer residual crystalline phases, than the coatings produced with larger particles (38 to 53 μm).
Figure 7B:
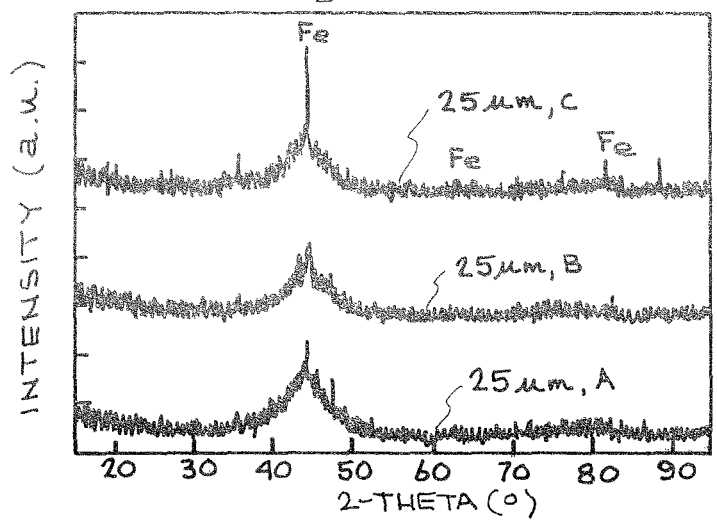
Figure 7C:
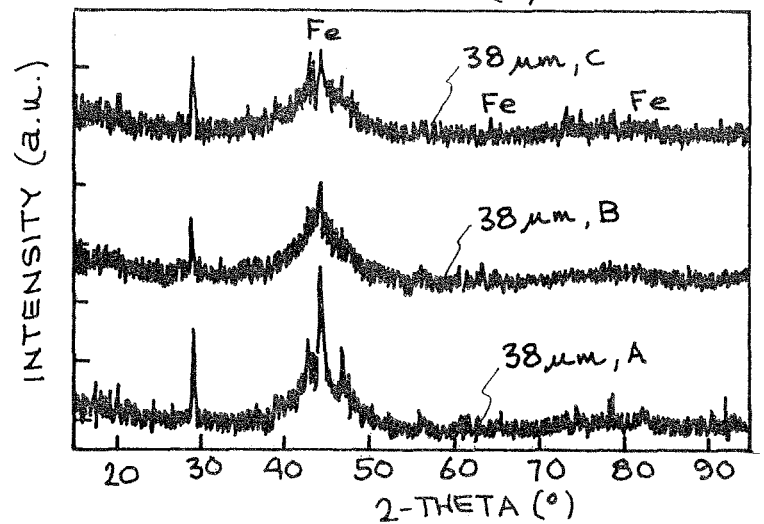

X-ray diffraction (XRD) data for the SAM40 (DAR40) coatings deposited with HVOF during the parametric study represented by FIG. 6 are shown in FIGS. 7A, 7B, & 7C. From this data, it is evident that the coatings produced with smaller particles (25 μm) are more amorphous in nature, with fewer residual crystalline phases, than the coatings produced with larger particles (38 to 53 μm). FIGS. 7A, 7B, & 7C show X-ray diffraction SAM40 (DAR40) deposited with HVOF during the parametric study show that the coatings produced with smaller particles (25 μm) are more glassy, with fewer residual crystalline phases, than the coatings produced with larger particles (38 to 53 μm).

Initial Images of Aged Melt-Spun Ribbons and Drop-Cast Ingots

Figure 8:
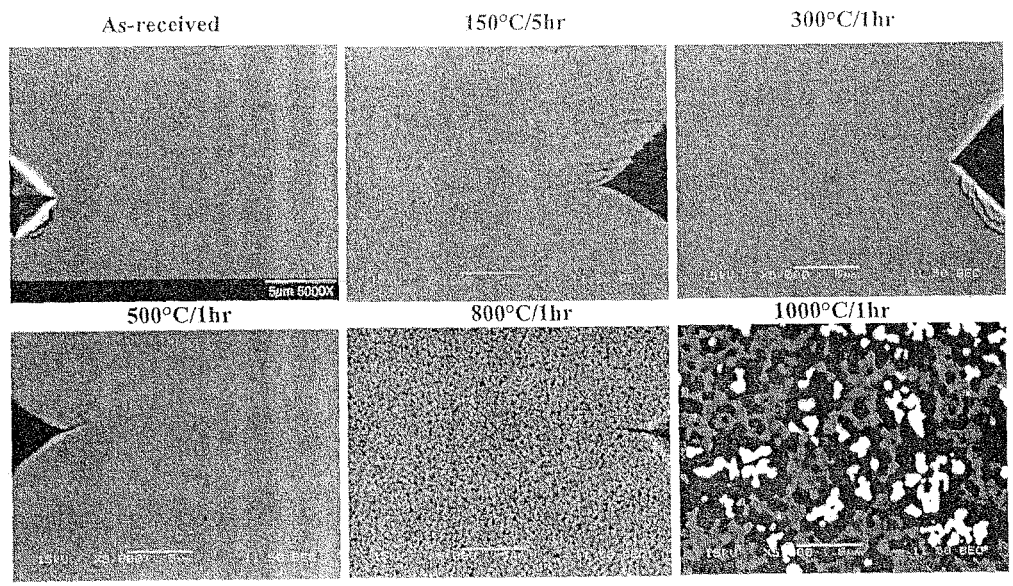
FIG. 8 elemental mapping shows the formation of crystalline phases in melt-spun ribbons of SAM40 (DAR40) after a 1-hour exposure at 800° C. Substantial crystallization occurs after a 1-hour exposure at 1000° C.
Figure 9:
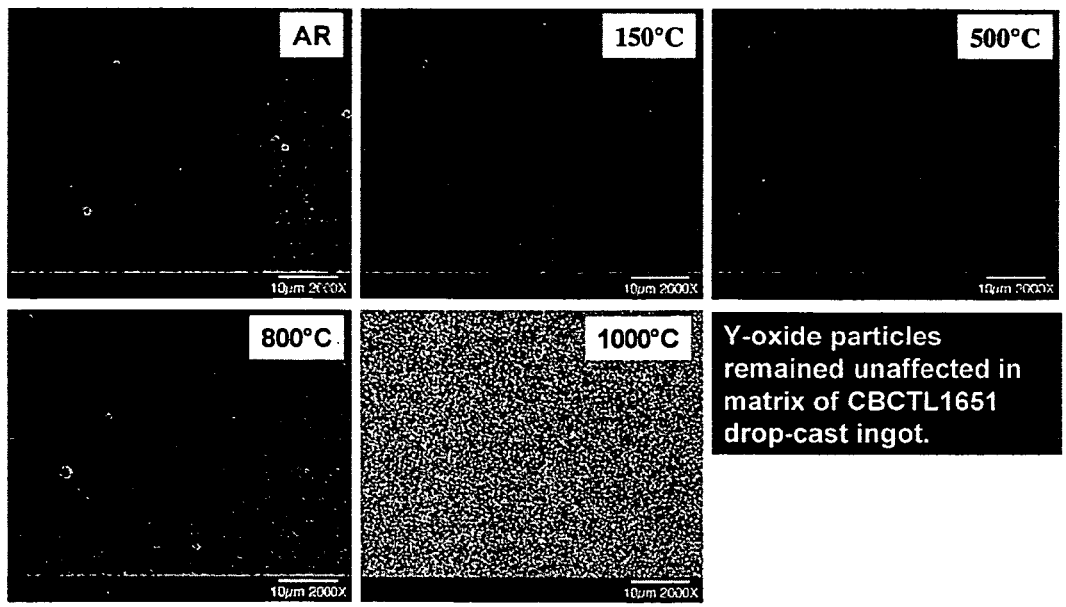
FIG. 9 elemental mapping shows no formation of crystalline phases in arc-melted drop-cast ingots of SAM1651 (LDAR7 OR CBCTL1651) after a 1-hour exposure at 800° C., but the onset of crystallization after a 1-hour exposure at 1000° C. Small yttrium oxide particles remained unaffected in the matrix.
Figure 10:
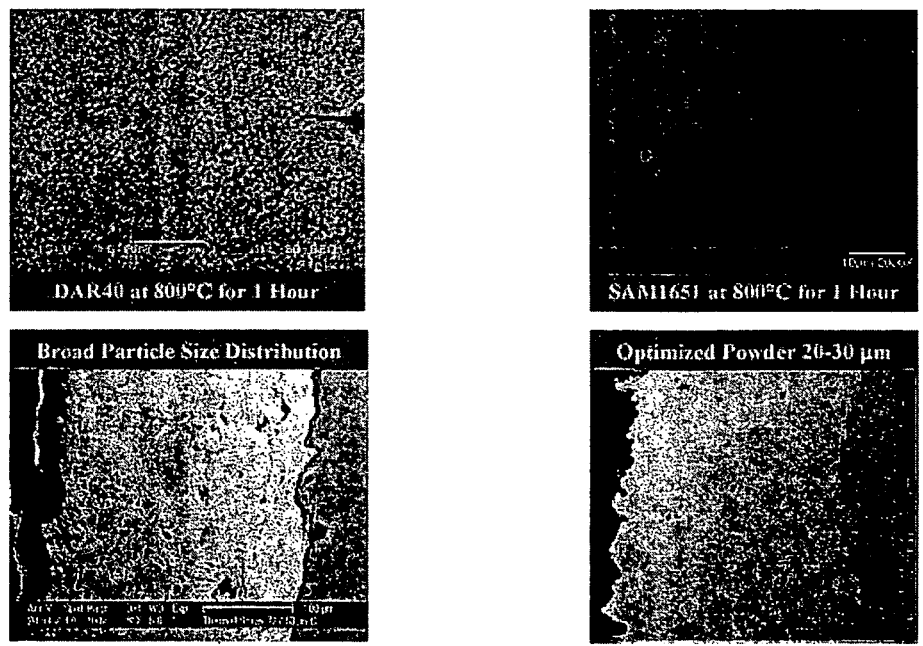
FIG. 10 shows a comparison of the original SAM40 (DAR40) formulation to the SAM1651 (LDAR7 OR CBCTL1651) formulation, in regard to thermal stability at 800° C. and coating morphology.

Elemental mapping of melt-spun ribbons shows the formation of crystalline phases in after a 1-hour exposure at 800° C. Substantial crystallization occurs after a 1-hour exposure at 1000° C. in FIG. 8. FIG. 8 shows Elemental mapping shows the formation of crystalline phases in melt-spun ribbons of SAM40 (DAR40) after a 1-hour exposure at 800° C. Substantial crystallization occurs after a 1-hour exposure at 1000° C. In contrast, elemental mapping drop cast ingots of SAM1651 shows no formation of crystalline phases in arc-melted drop-cast ingots of SAM1651 after a 1-hour exposure at 800° C., but the onset of crystallization after a 1-hour exposure at 1000° C. Small yttrium oxide particles remained unaffected in the matrix as illustrated in FIG. 9. FIG. 9 shows elemental mapping shows no formation of crystalline phases in arc-melted drop-cast ingots of SAM1651 after a 1-hour exposure at 800° C., but the onset of crystallization after a 1-hour exposure at 1000° C. Small yttrium oxide particles remained unaffected in the matrix. Progress made is illustrated with FIG. 10. FIG. 10 shows a comparison of the original SAM40 (DAR40) formulation in 2004 to the SAM1651 (LDAR7 OR CBCTL1651) formulation in 2005, in regard to thermal stability at 800° C. and coating morphology.

Thermal Analysis

A summary of the thermal analysis data for melt-spun ribbons is given in Table 2 below, which shows all of the acquired information to date on Fe-alloys investigated during the first year of this project. The table lists glass transition temperature $T_g$ crystallization temperature $T_x$ (of the amorphous phase), onset of melting $T_m$ and liquidus temperature $T_l$. In addition, a rough measure of the glass forming ability is listed as $T_{rg}$, the reduced glass transition temperature defined as $T_g/T_l$ where temperatures are given in degrees Kelvin. Good glass forming alloys have high reduced glass transition temperatures of about 0.55-0.60. There are other ways of defining the glass-forming ability (GFA) based on a thermal analysis; however, they all have in common that one method may fit a particular alloy better than a different method. Caution is therefore advised when using thermal analysis as means of estimating GFA.

TABLE 2

| Alloy | $T_g$ (° C.) | $T_x$ (° C.) | $T_m$ (° C.) | $T_L$ (° C.) | $T_{rg}$ (° C.) |
|---|---|---|---|---|---|
| SAM35 | 545-565 | 613 | 1074 | 1350 | 0.51 |
| SAM40 | 568-574 | 623 | 1110 | 1338 | 0.53 |
| SAM40X3 | 561-567 | 630 | 1130 | 1260 | 0.55 |
| SAM1X1 | not clear | 612 | 1121 | min. 1270 | N.A. |
| SAM1X3 | 560 | 589 | 1119 | min. 1300 | 0.53 |
| SAM1X5 | 540 | 572 | 1115 | min. 1300 | 0.52 |
| SAM1X7 | 510 | 545 | 1112 | min. 1300 | 0.50 |
| SAM2X1 | 575 | 620 | 1124 | 1190-1210 | 0.57 |
| SAM2X3 | 578 | 626 | 1131 | 1190-1210 | 0.57 |
| SAM2X5 | 579 | 628 | 1133 | 1190-1210 | 0.57 |
| SAM2X7 | 573 | 630 | 1137 | 1190-1210 | 0.57 |
| SAM3X1 | 560 | 614 | 1108 | min. 1320 | 0.52 |
| SAM3X3 | 573 | 659 | 1138 | min. 1380 | 0.51 |
| SAM3X5 | 590 | 677 | 1143 | min. 1400 | 0.52 |
| SAM3X7 | not clear | 697 | 1164 | min. 1420 | |
| SAM4X1 | 573 | 621 | 1135 | min. 1300 | 0.54 |
| SAM4X3 | 568 | 623 | 1146 | min. 1320 | 0.53 |
| SAM4X5 | 580 | 623 | 1194 | 1290 | 0.55 |
| SAM4X7 | 558 | 616 | 1198 | 1255 | 0.54 |
| SAM5X1 | 570 | 622 | 1134 | min. 1360 | 0.52 |

TABLE 2-continued

| Alloy | $T_g$ (° C.) | $T_x$ (° C.) | $T_m$ (° C.) | $T_L$ (° C.) | $T_{rg}$ (° C.) |
|---|---|---|---|---|---|
| SAM5X3 | 575 | 641 | 1147 | min. 1410 | 0.50 |
| SAM5X5 | 596 | 659 | 1193 | min. 1420 | 0.51 |
| SAM6 | 580 | 623[2)] | 995 | 1238-1250 | 0.56 |
| SAM7 | 584 | 653[2)] | 1121 | 1290 | 0.55 |
| SAM8 | 565 | 637[2)] | 1137 | 1350-1370 | 0.52 |
| SAM9 | 572 | 677[2)] | 1146 | 1223 | 0.56 |
| SAM10 | 535 | 568[1)] | 1210 | 1350-1370 | 0.50 |
| SAM11 | 535 | 572[1)] | 1202 | 1365-1395 | 0.49 |

Note that a comparison of h for different wedge-casts can be used qualitative to describe heat transfer properties of the sample alloy, since it is expected that the overall h should not be very different for modest changes in the composition. Heat transfer at the melt-mold interface dictates the overall cooling behavior through an apparent temperature dependent heat transfer coefficient.

Predicted Pourbaix Diagrams

Figure 11A:
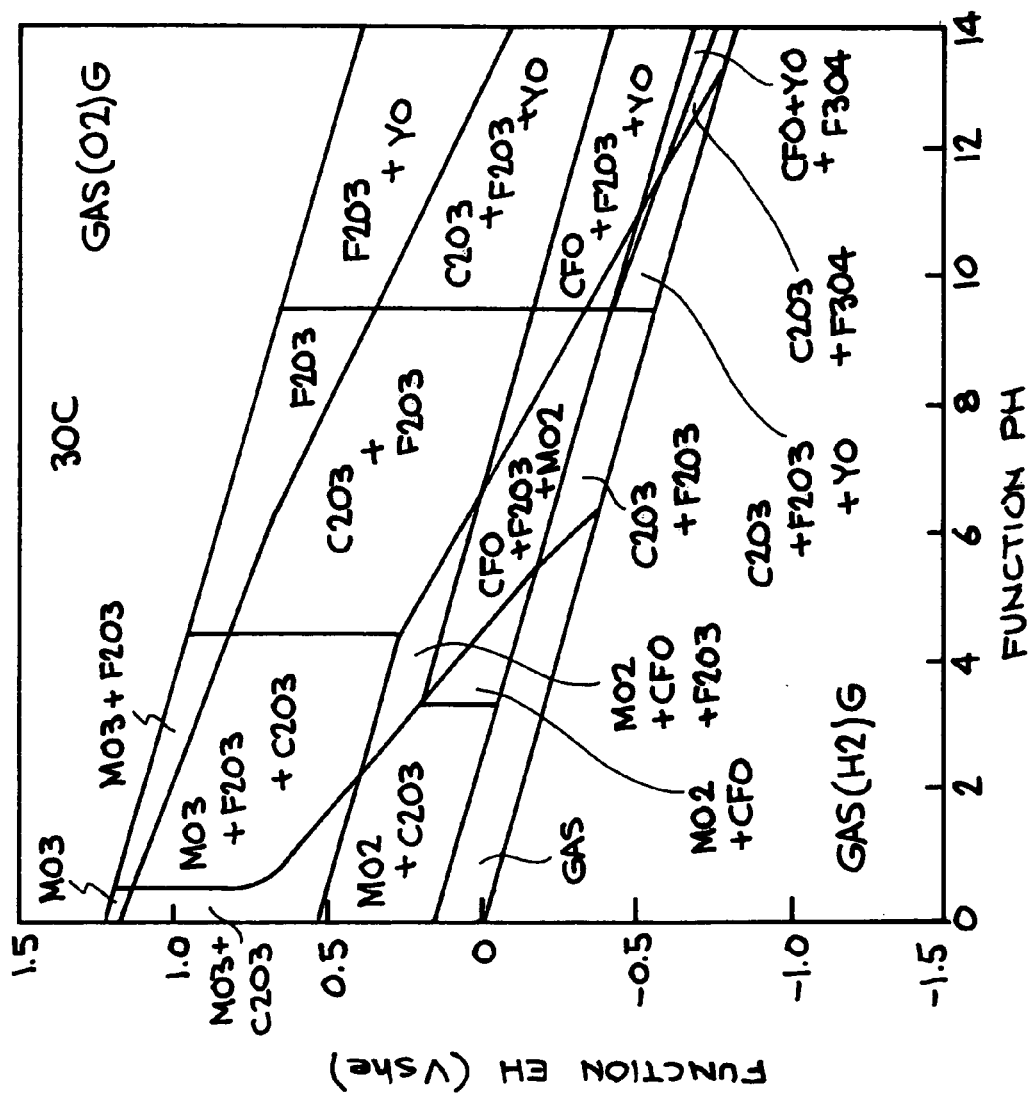
FIGS. 11A and 11B predicted Pourbaix diagrams for SAM1651 (LDAR7 OR CBCTL1651) and SAM1651+W amorphous metal formulations in synthetic seawater at near-ambient temperature (30° C.). In the later case, the presence of tungsten leads to the formation of $FeWO_4$ and $WO_2(OH)_2$, while the presence of molybdenum leads to the formation of $MoO_2$ and $MO_3$. Chromium and iron oxides ($Cr_2O_3$ and $Fe_2O_3$) also contribute to passive film stability. Under alkaline conditions, stable $Y_2O_3$ and $NaO_4W$ surface phases are predicted. Such predicted Pourbaix diagrams, and the capability developed to make such predictions, is clear evidence that Milestone 1 has been met.
Figure 11B:
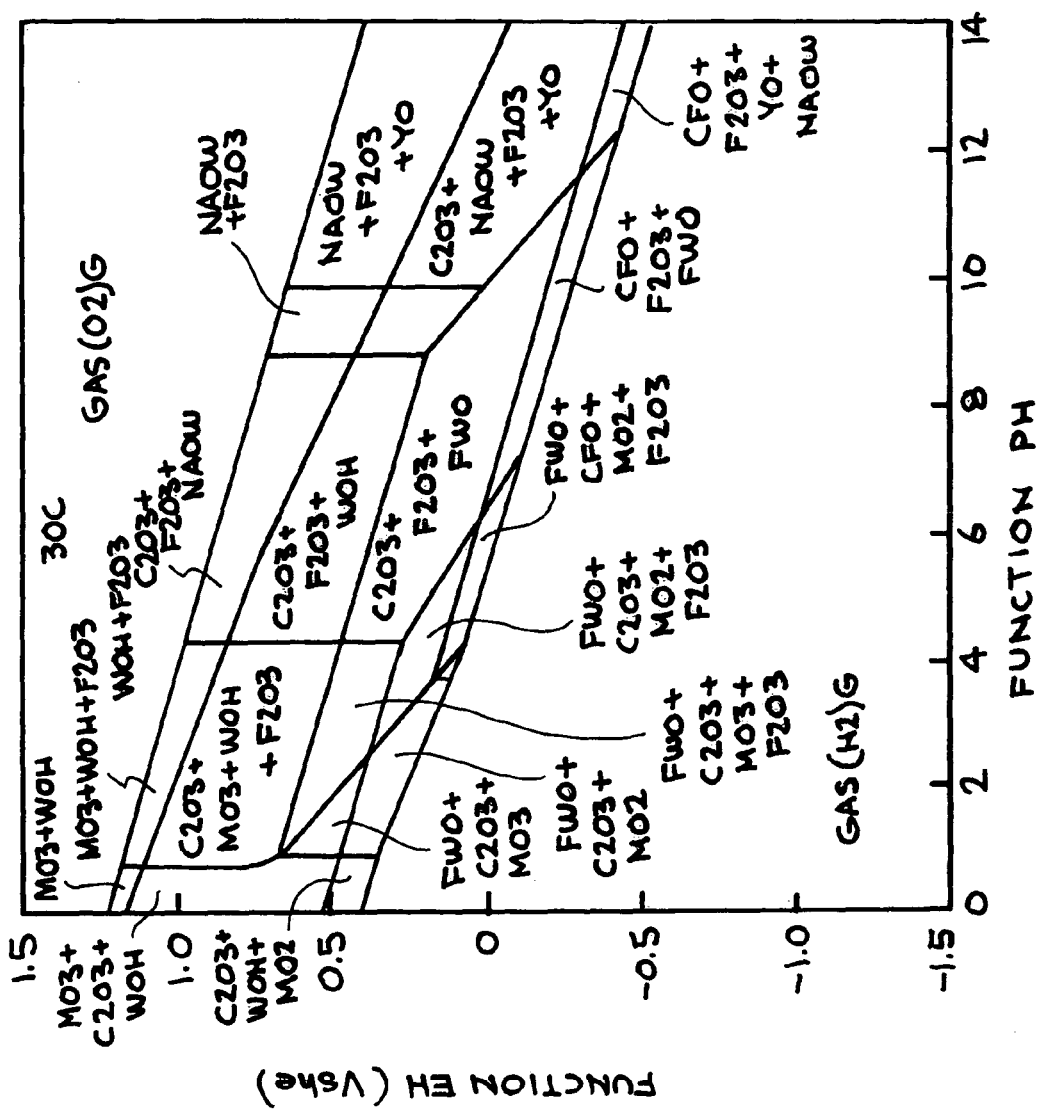

The predicted Pourbaix diagrams for SAM1651 and LDAR8 (SAM1651 with tungsten) in synthetic seawater at near-ambient temperature (30° C.) are shown in FIGS. 11A and 11B. FIGS. 11A and 11B show predicted Pourbaix diagrams for SAM1651 and SAM1651+W amorphous metal formulations in synthetic seawater at near-ambient temperature (30° C.). In the later case, the presence of tungsten leads to the formation of $FeWO_4$ and $WO_2(OH)_2$, while the presence of molybdenum leads to the formation of $MoO_2$ and $MO_3$. Chromium and iron oxides ($Cr_2O_3$ and $Fe_2O_3$) also contribute to passive film stability. Under alkaline conditions, stable $Y_2O_3$ and $NaO_4W$ surface phases are predicted. Such predicted Pourbaix diagrams, and the capability developed to make such predictions, is clear evidence that Milestone 1 has been met.

In the later case, the presence of tungsten leads to the formation of $FeWO_4$ and $WO_2(OH)_2$, while the presence of molybdenum leads to the formation of $MoO_2$ and $MO_3$. Chromium and iron oxides ($Cr_2O_3$ and $Fe_2O_3$) also contribute to passive film stability. Under alkaline conditions, stable $Y_2O_3$ and $NaO_4W$ surface phases are predicted. Such predicted Pourbaix diagrams, and the capability developed to make such predictions, is clear and concrete evidence that Milestone 1 has been met.

Figure 12A:
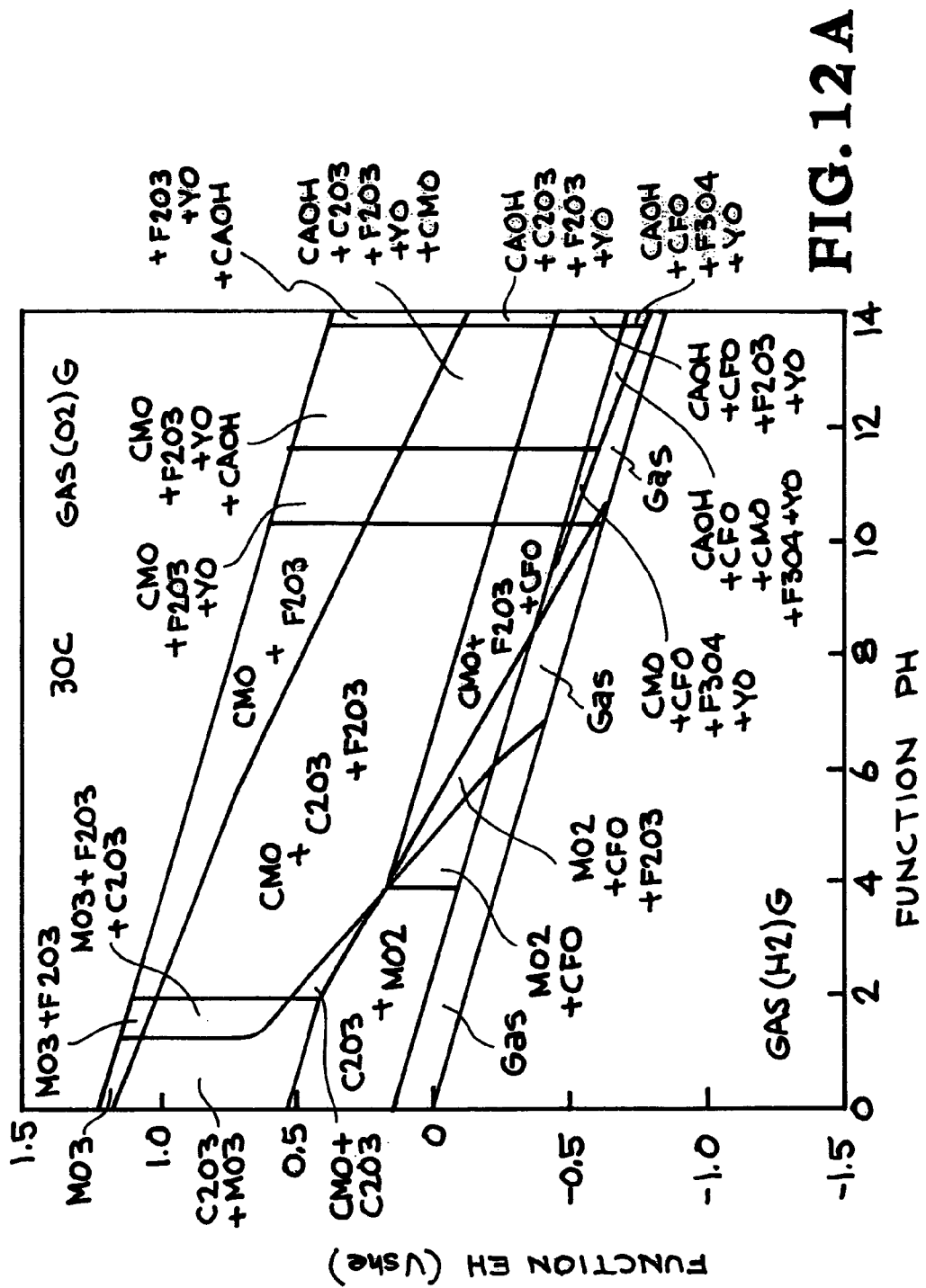
FIGS. 12A and 12B predicted Pourbaix diagrams for SAM1651 amorphous metal formulations in concentrated calcium chloride brines at 30 and 90° C. Under acidic-to-neutral conditions, $MoO_2$, $MO_3$, $CaO-MO_3$, $Cr_2O_3$ and $Fe_2O_3$ contribute to passive film stability. Under alkaline conditions, stable $Y_2O_3$ and $Ca(OH)_2$ surface phases are also predicted.
Figure 12B:
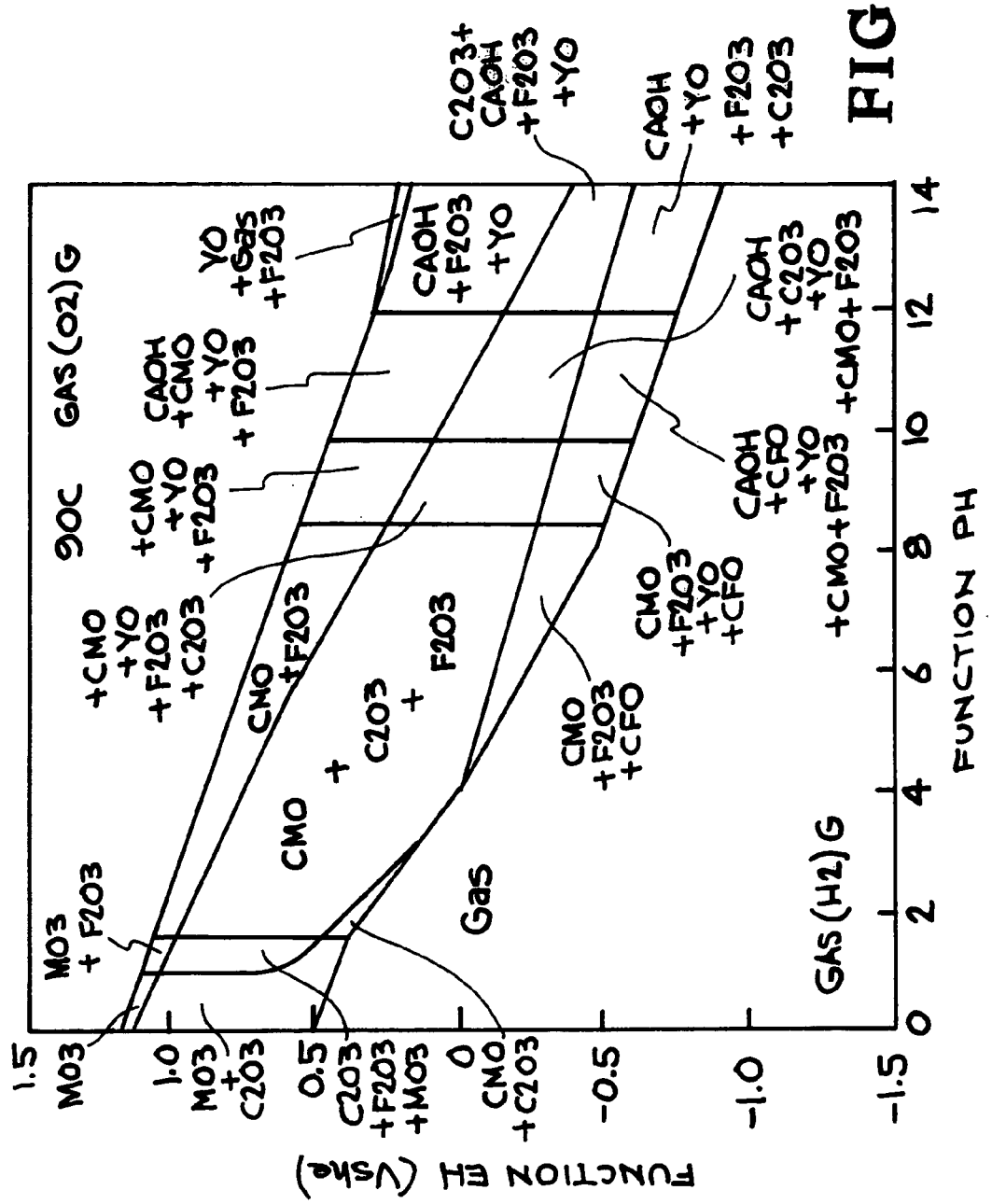

The predicted Pourbaix diagrams for SAM1651 (LDAR7 OR CBCTL1651) in concentrated calcium chloride brines at 30 and 90° C. are shown in FIGS. 12A and 12B. FIGS. 12A and 12B show predicted Pourbaix diagrams for SAM1651 (LDAR7 OR CBCTL1651) amorphous metal formulations in concentrated calcium chloride brines at 30 and 90° C. Under acidic-to-neutral conditions, $MoO_2$, $MO_3$, CaO—$MO_3$, $Cr_2O_3$ and $Fe_2O_3$ contribute to passive film stability. Under alkaline conditions, stable $Y_2O_3$ and $Ca(OH)_2$ surface phases are also predicted.

Under acidic-to-neutral conditions, $MoO_2$, $MO_3$, CaO—$MO_3$, $Cr_2O_3$ and $Fe_2O_3$ contribute to passive film stability. Under alkaline conditions, stable $Y_2O_3$ and $Ca(OH)_2$ surface phases are also predicted.

Figure 13A:
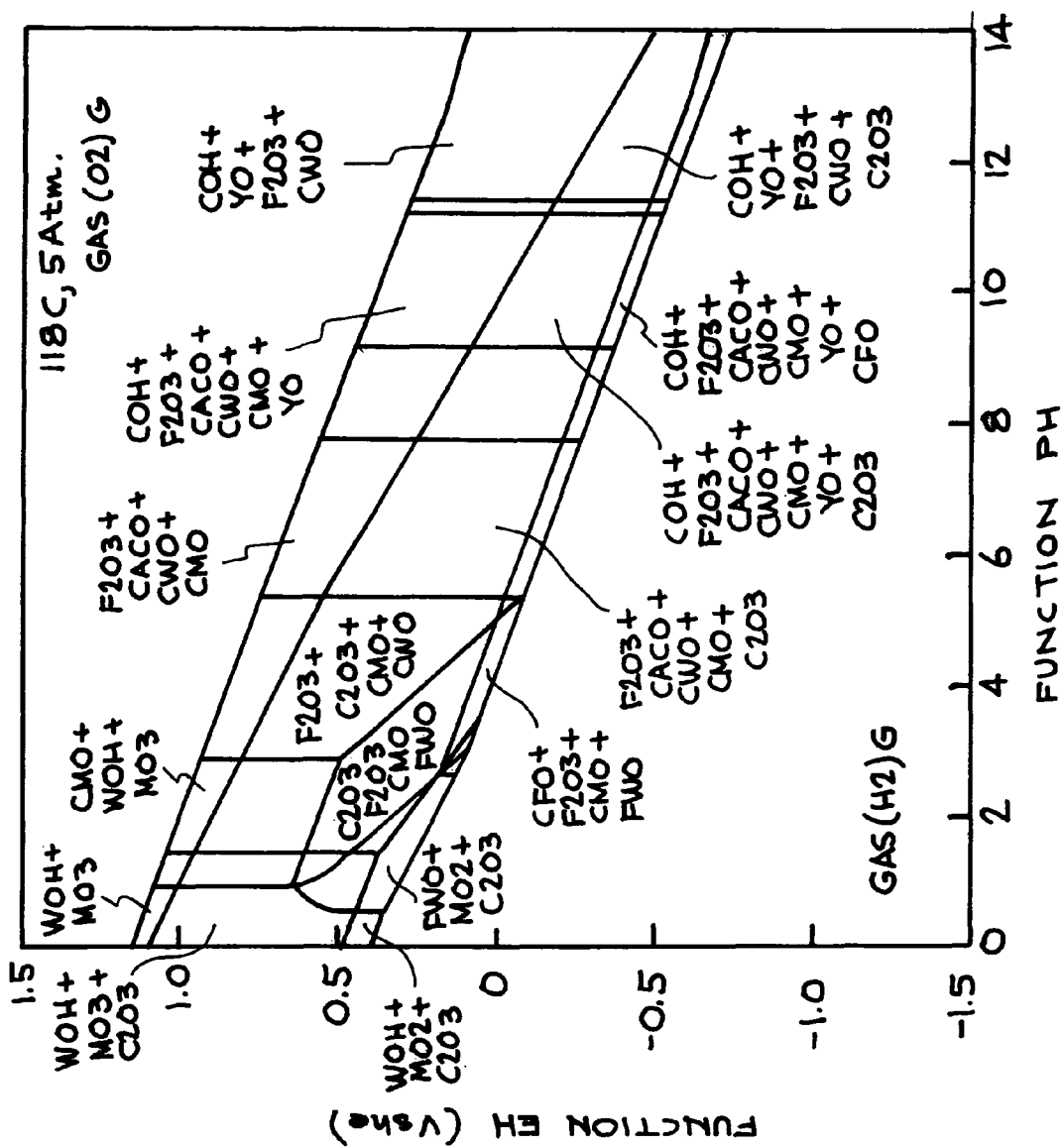
FIGS. 13A and 13B predicted Pourbaix diagrams for SAM1651+W amorphous metal formulations in concentrated calcium chloride brines at 105 and 118° C. The presence of tungsten leads to the formation of $FeWO_4$ and $WO_2(OH)_2$, while the presence of molybdenum leads to the formation of $MoO_2$, $MO_3$ and $CaO—MO_3$. Chromium and iron oxides ($Cr_2O_3$ and $Fe_2O_3$) also contribute to passive film stability. Under alkaline conditions, stable $Y_2O_3$ and $Ca(OH)_2$ surface phases are predicted.
Figure 13B:
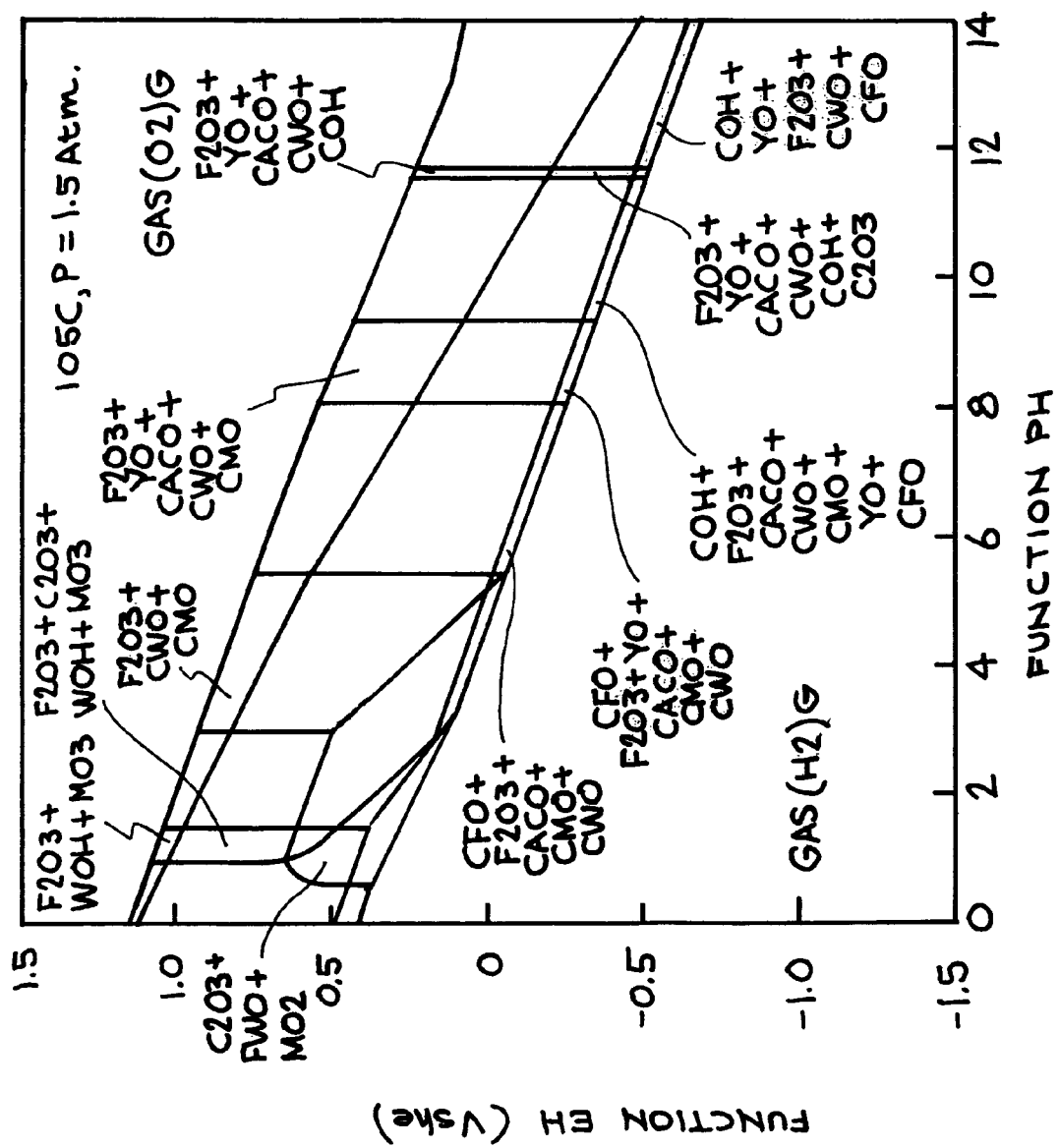

The predicted Pourbaix diagrams for LDAR8, with tungsten at a concentration of 3 atomic percent, in concentrated calcium chloride brines at 105 and 118° C. are shown in FIGS. 13A and 13B. FIGS. 13A and 13B show predicted Pourbaix diagrams for +W amorphous metal formulations in concentrated calcium chloride brines at 105 and 118° C. The presence of tungsten leads to the formation of $FeWO_4$ and $WO_2(OH)_2$, while the presence of molybdenum leads to the formation of $MoO_2$, $MO_3$ and CaO—$MO_3$. Chromium and iron oxides ($Cr_2O_3$ and $Fe_2O_3$) also contribute to passive film stability. Under alkaline conditions, stable $Y_2O_3$ and $Ca(OH)_2$ surface phases are predicted.

The presence of tungsten leads to the formation of $FeWO_4$ and $WO_2(OH)_2$, while the presence of molybdenum leads to the formation of $MoO_2$, $MO_3$ and CaO—$MO_3$. Chromium and iron oxides ($Cr_2O_3$ and $Fe_2O_3$) also contribute to passive film stability. Under alkaline conditions, stable $Y_2O_3$ and $Ca(OH)_2$ surface phases are predicted.

Electrochemical Corrosion Testing

Cyclic polarization (CP) is used as a means of measuring the critical potential ($E_{critical}$) of corrosion resistant materials, relative to their open-circuit corrosion potential ($E_{corr}$). Spontaneous breakdown of the passive film and localized corrosion require that the open-circuit corrosion potential exceed the critical potential.

In the published scientific literature, different bases exist for determining the critical potential from electrochemical measurements. Some have defined the critical potential for crevice corrosion of Alloy 22 as the point where the current density increases to 1 to 10 mA/cm$^2$ ($10^{-6}$ to $10^{-5}$ A/cm$^2$) during the forward (anodic) scan, whereas others define the repassivation potential as the point where the current density drops to 0.1 to 1 mA/cm$^2$ ($10^{-6}$ to $10^{-7}$ A/cm$^2$), and use the repassivation potential as a conservative estimate of the critical value.

Cyclic polarization measurements have been based on a procedure similar to ASTM G-5, with slight modification [American Society for Testing and Materials]. For example, ASTM G-5 calls for an electrolyte of 1N $H_2SO_4$, whereas natural seawater, synthetic bicarbonate brines, synthetic sulfate-chloride brines, 4M NaCl solutions, and 5M $CaCl_2$ solutions with various levels of nitrate were used in this study. The compositions of the synthetic brines are given in the literature. Furthermore, ASTM G-5 calls for the use of de-aerated solutions, whereas aerated and de-aerated solutions were used here. After a 24-hour hold period, during which the open circuit corrosion potential is determined, the potential is scanned in the positive (anodic) direction from a level slightly more negative than the corrosion potential (cathodic limit), to a reversal potential ($E_{rev}$) near that required for oxygen evolution (anodic level). During the positive scan, anodic oxidation peaks may be observed (centered at $E_{peak}$) that have been correlated with the oxidation of molybdenum at the alloy surface (passive film), as well as current excursions that are usually associated with breakdown of the passive film. During the negative (cathodic) scan, a hysteresis loop will be observed in cases where passivity has been lost. As the scan continues, the current density may eventually decrease to a level equivalent to that experienced during the positive scan, and indicative of reformation of the passive film. The potential at which this occurs is known as the repassivation potential ($E_{rp}$).

A temperature-controlled, borosilicate glass (Pyrex), electrochemical cell was used. This cell had three electrodes, a working electrode (test specimen), the reference electrode, and the counter electrode. A standard silver silver-chloride electrode, filled with near-saturation potassium chloride solution, was used as the reference, and communicated with the test solution via a Luggin probe placed in close proximity to the working electrode, thereby minimizing Ohmic losses. Numerical corrections for the reference electrode junction potential have been estimated, and have been found to be insignificant. The electrochemical cell was equipped with a water-cooled junction to maintain reference electrode at ambient temperature, thereby maintaining integrity of the potential measurement, and a water-cooled condenser to prevent the loss of volatile species from the electrolyte.

The resistance to localized corrosion is quantified through measurement of the open-circuit corrosion potential ($E_{corr}$), the breakdown potential ($E_{crit}$) and the repassivation potential ($E_{rp}$). The greater the difference between the open-circuit corrosion potential and the repassivation potential ($\Delta E$), the more resistant a material is to modes of localized corrosion such as pitting and crevice corrosion.

Competing methodologies exist for the interpretation of experimental data in terms of the critical potential ($E_{crit}$). Method A strives to identify the potential where the passive film disappears during the forward (anodic) potential scan. The loss of passivity is indicated by a sudden, dramatic increase in the measured current density. The current density corresponding to a complete loss of passivity is assumed to be approximately 20 or 200 mA/cm². The breakdown potential may be the best estimate of the true critical potential, since it corresponds to the onset of passive film destabilization. Methods B and C strive to identify the potential where the passive film reappears during the negative (cathodic) potential scan. Repassivation is indicated by a sudden, precipitous decrease in the measured current density, to levels indicative of an intact passive film. Method C relies on no arbitrary threshold, and is therefore preferred.

Method A—Initial Breakdown of Passive Film
Critical Potential ($E_{crit}$)=Breakdown Potential (E20 or E200)
Based Threshold Current Density of 20 or 200 mA/cm²
Method B—Repassivation of Surface
Critical Potential ($E_{crit}$)=Repassivation Potential (ER1 or ER²)
Based Threshold Current Density of 1 or 2 mA/cm²
Method C—Repassivation of Surface
Critical Potential ($E_{crit}$)=Repassivation Potential (ERP)
Intersection of Forward Scan with Hysteresis Loop (Cross-Over Point)

Figure 14:
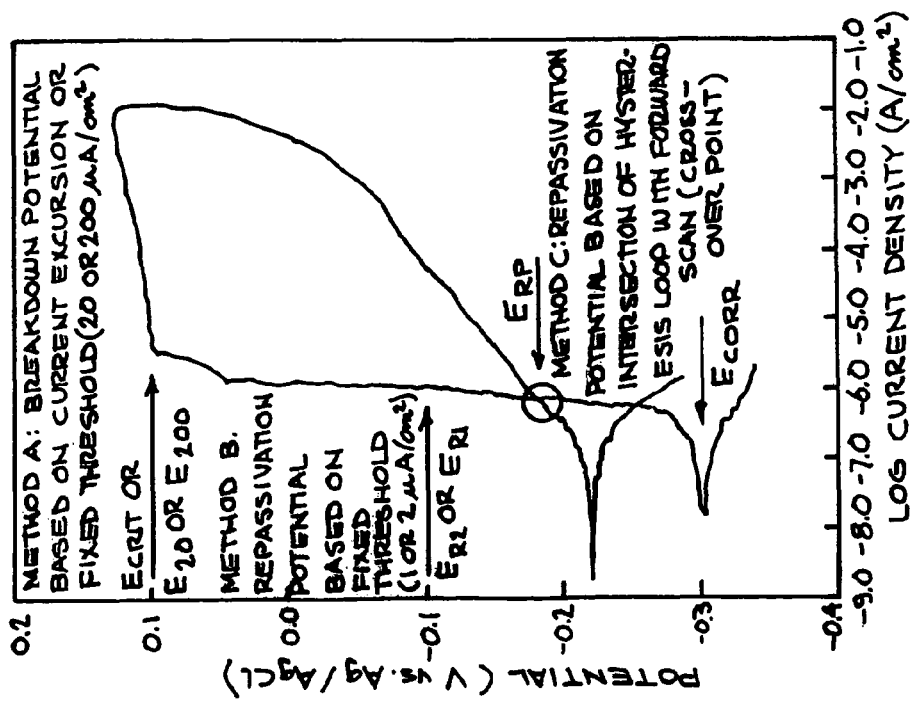
FIG. 14 is an actual cyclic polarization curve for Alloy C-22 in 5M $CaCl_2$ at 105° C., showing three methodologies for determining the threshold potential for the initiation of localized corrosion in performance assessment models. Method A is based upon the critical potential at which the passive film breaks down (current excursion, 2 or 20 $mA/cm^2$). Method B is based upon the repassivation potential, which in turn is based upon an arbitrary threshold (1 or 2 mA/cm2). Method C is based upon the repassivation potential, determined from the intersection of the hysteresis loop with the forward scan.

FIG. 14 shows an actual cyclic polarization curve for Alloy C-22 in 5M CaCl₂ at 105° C., with three methodologies illustrated for determining the threshold potential for the initiation of localized corrosion in performance assessment models. Method A is based upon the critical potential at which the passive film breaks down (current excursion, 2 or 20 mA/cm²). FIG. 14 is an actual cyclic polarization curve for Alloy C-22 in 5M CaCl₂ at 105° C., showing three methodologies for determining the threshold potential for the initiation of localized corrosion in performance assessment models. Method A is based upon the critical potential at which the passive film breaks down (current excursion, 2 or 20 mA/cm²). Method B is based upon the repassivation potential, which in turn is based upon an arbitrary threshold (1 or 2 mA/cm²). Method C is based upon the repassivation potential, determined from the intersection of the hysteresis loop with the forward scan.

Method B is based upon the repassivation potential, which in turn is based upon an arbitrary threshold (1 or 2 mA/cm²). Method C is based upon the repassivation potential, determined from the intersection of the hysteresis loop with the forward scan, and is preferred.

Figure 15:
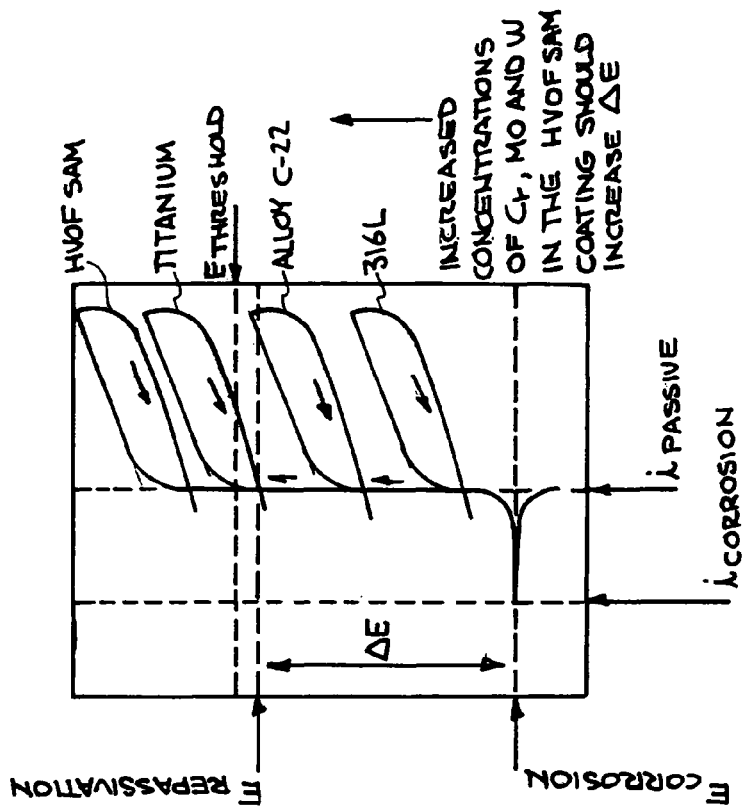
FIG. 15 shows the predicted role of chromium, molybdenum, tungsten and titanium on passive film stability, based upon knowledge of the Pourbaix diagrams of each of these alloying elements. This figure was based on an earlier figure prepared for presentation to the Nuclear Waste Technical Review Board, but without any specific reference to HVOF SAM. This was an earlier prediction (cartoon depiction of the yet-to-be-measured performance of SAM2X5 (LDAR2X5) and SAMI651 (LDAR7 OR CBCTL1651).
Figure 16B:
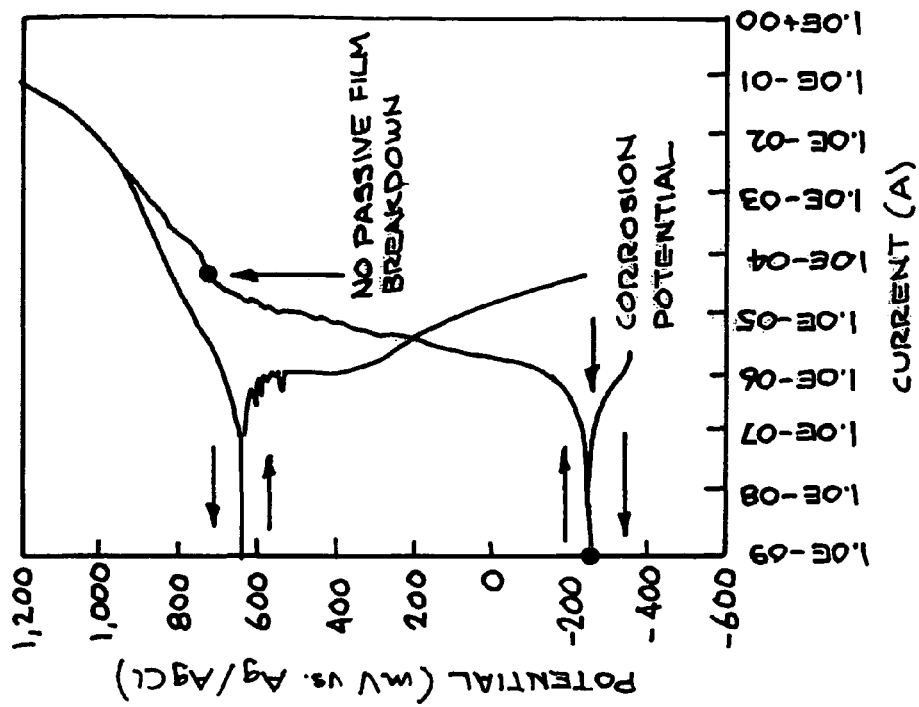
FIGS. 16A and 16B show the benefits of Mo additions on the enhancement of Alloy C-22 corrosion resistance in comparison to that of Type 316L stainless steel. This recognized beneficial effect of molybdenum has been fully exploited in the enhancement and optimization of the early DAR-type compositions of NanoSteel, thereby rendering them far more corrosion resistant than first observed.
Figure 16A:
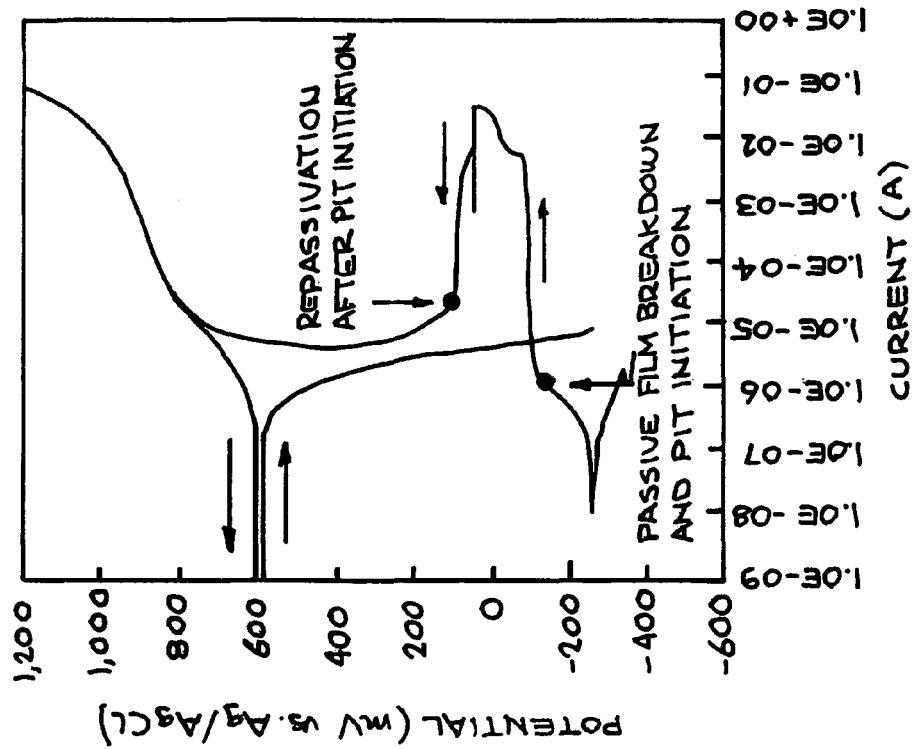

A premise of this research is that the corrosion-resistance of Fe-based amorphous metals can be improved by systematic addition of alloying elements such as chromium, molybdenum, and tungsten, all of which are known to enhance passive film stability (FIG. 15). FIG. 15 shows the predicted role of chromium, molybdenum, tungsten and titanium on passive film stability, based upon knowledge of the Pourbaix diagrams of each of these alloying elements. This Figure was based on an earlier Figure prepared for presentation to the Nuclear Waste Technical Review Board, but without any specific reference to HVOF SAM. This was an earlier prediction (cartoon depiction of the yet-to-be-measured performance of SAM2X5 (LDAR2X5) and SAM1651 (LDAR7 OR CBCTL1651)). Such elemental additions account for the observed difference in the corrosion resistance of Type 316L stainless steel, and nickel-based Alloy C-22 (FIGS. 16A and 16B). FIGS. 16A and 16B show early data of Farmer et al clearly show the benefits of Mo additions on the enhancement of Alloy C-22 corrosion resistance in comparison to that of Type 316L stainless steel. This recognized beneficial effect of molybdenum has been fully exploited in the enhancement and optimization of the early DAR-type compositions of NanoSteel, thereby rendering them far more corrosion resistant than first observed.

Figure 17:
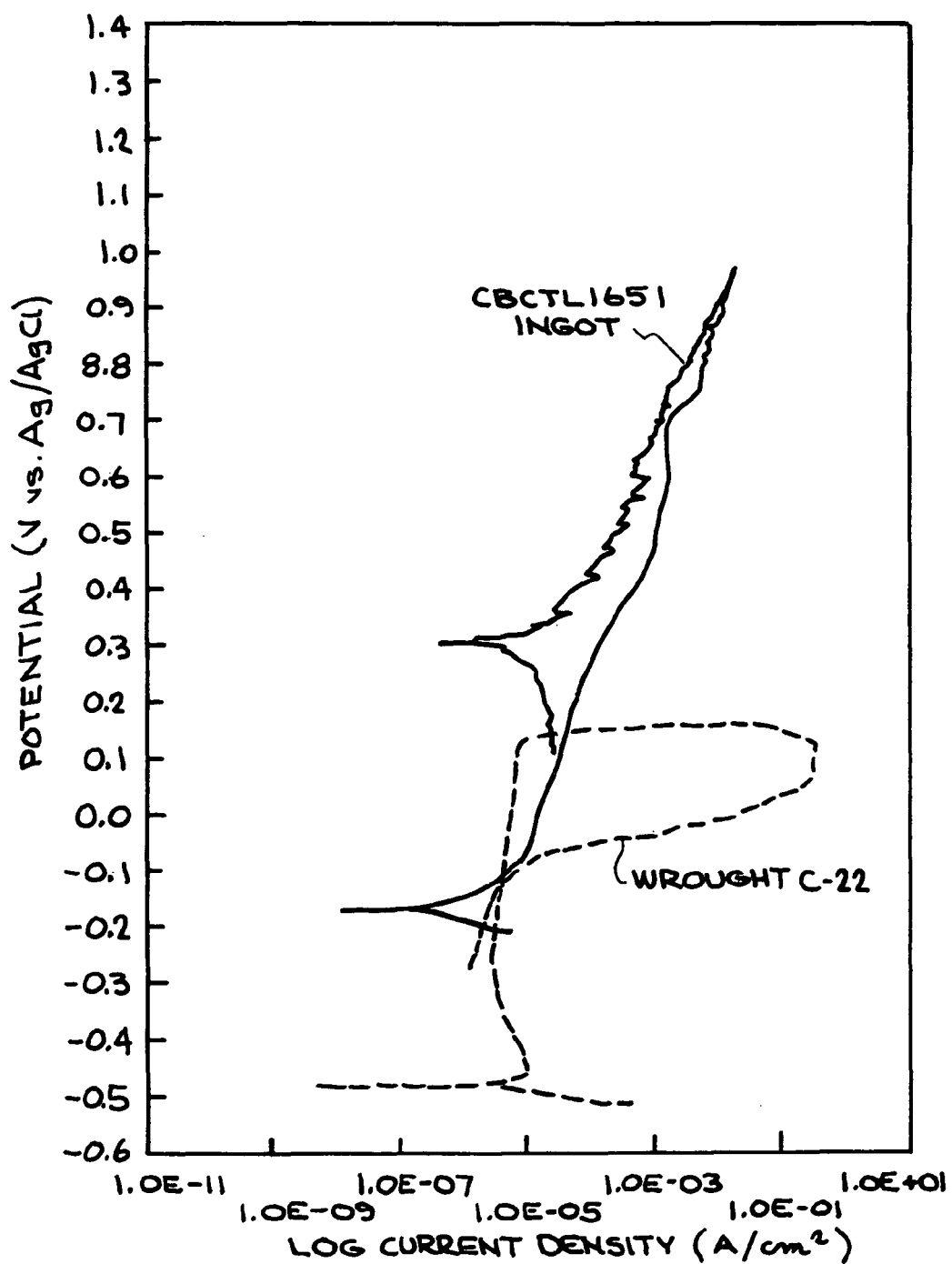
FIG. 17 cyclic polarization of wrought nickel based Alloy C-22 (N06022) and iron-based amorphous metal (SAM1651) ingot in 5M $CaCl_2$ at 105° C. Alloy C-22 shows catastrophic breakdown of the passive film at 100 mV vs. Ag/AgCl, which causes a very large hysteresis loop. During the reverse scan, repassivation occurs at a relatively low potential (–150 to –200 mV). While there was catastrophic breakdown of the Alloy C-22 at very low potential (100 to 200 mV vs. Ag/AgCl), no breakdown of the passive film on SAM1651 ingot was observed, even at potentials approaching that required for oxygen evolution.

Cyclic Polarization of Published SAM1651 (LDAR7 OR CBCTL1651) Composition (Joe Poon Alloy) in Hot CaCl2 Brines Cyclic polarization testing of reference materials such as Alloy C-22 and various Fe-based amorphous metals were conducted in 5M CaCl₂ at 105° C. Data for wrought nickel-based Alloy C-22 (N06022) and iron-based SAM1651 (LDAR7 OR CBCTL1651) amorphous metal ingot are compared in FIG. 17. FIG. 17 shows Cyclic polarization of wrought nickel based Alloy C-22 (N06022) and iron-based amorphous metal SAM1651 (LDAR7 OR CBCTL1651) ingot in 5M CaCl₂ at 105° C. Alloy C-22 shows catastrophic breakdown of the passive film at 100 mV vs. Ag/AgCl, which causes a very large hysteresis loop. During the reverse scan, repassivation occurs at a relatively low potential (−150 to −200 mV). While there was catastrophic breakdown of the Alloy C-22 at very low potential (100 to 200 mV vs. Ag/AgCl), no breakdown of the passive film on ingot was observed, even at potentials approaching that required for oxygen evolution.

The data for Alloy C-22 show a breakdown of the passive film at 100 mV, which causes a very large hysteresis loop. During the reverse scan, repassivation occurs at a relatively low potential (−150 to −200 mV vs. Ag/AgCl). These data indicate that Alloy C-22 has relatively poor resistance to localized corrosion in the test environment. In sharp contrast to Alloy C-22, the SAM1651 (LDAR7 OR CBCTL1651) ingot showed no breakdown of the passive film, even at potentials approaching that required for oxygen evolution. It is therefore concluded that the corrosion resistance of the amorphous metal is superior to that of Alloy C-22 in hot concentrated calcium chloride solution.

Figure 18:
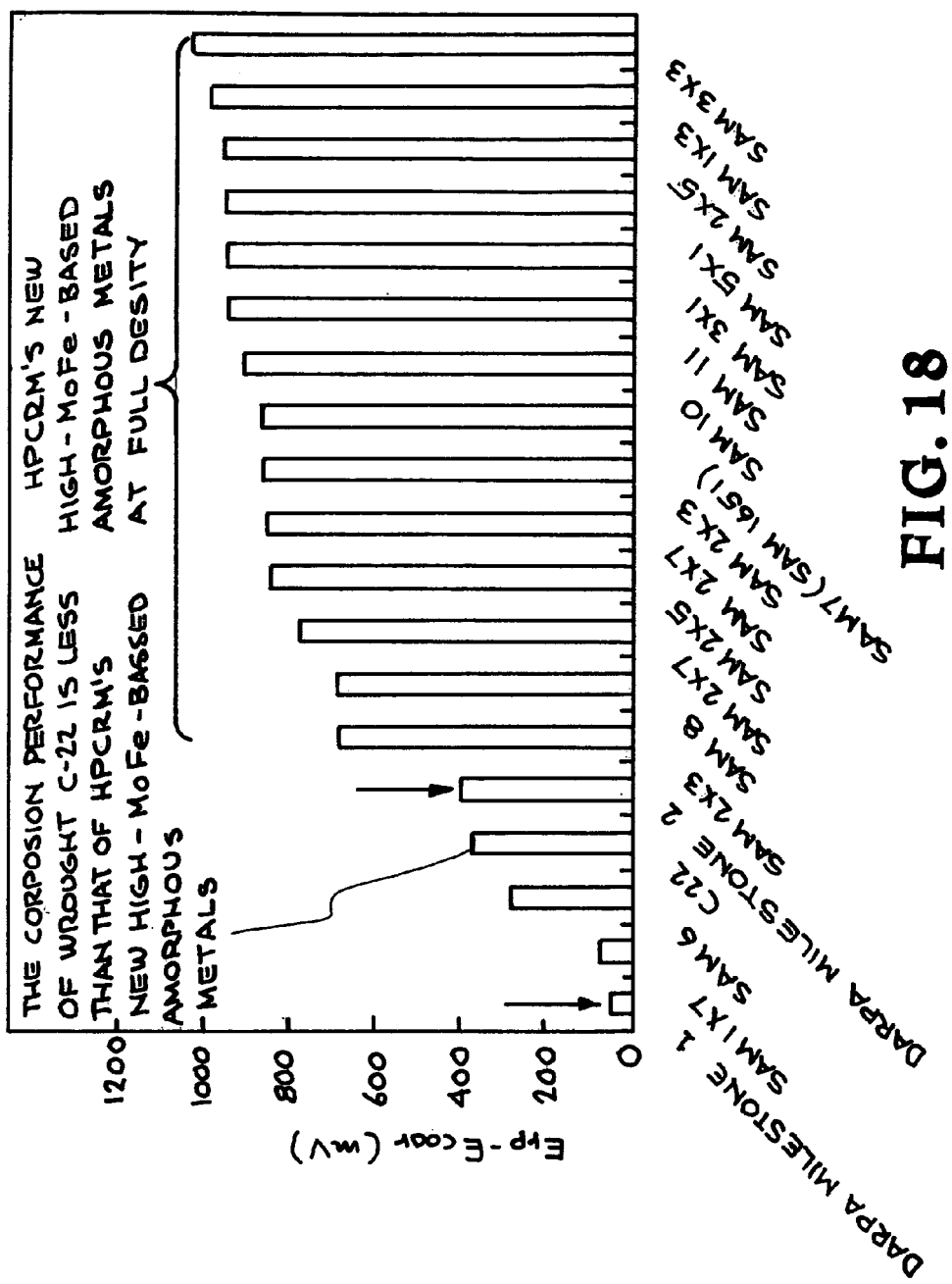
FIG. 18 various alloy samples, ranked based upon their measured resistance to localized corrosion ($\Delta E = E_{corr} - E_{rp}$) in 5M CaCl2 at 105° C. With the exception of the P-containing Fe-based amorphous metal (Pang et al.), most of the amorphous metals performed very well in this aggressive environment. In contrast, the performance of the wrought nickel-based Alloy C-22 (N06022) was relatively poor.

Cyclic polarization data for a wide range of alloy compositions in hot calcium chloride are summarized in FIG. 18. FIG. 18 shows various alloy samples, ranked based upon their measured resistance to localized corrosion ($\Delta E = E_{corr} - E_{rp}$) in 5M CaCl2 at 105° C. With the exception of the P-containing Fe-based amorphous metal (Pang et al.), most of the amorphous metals performed very well in this aggressive environment. In contrast, the performance of the wrought nickel-based Alloy C-22 (N06022) was relatively poorly. The LDAR8 (SAM8) formulation uses SAM1651 (LDAR7 OR CBCTL1651); Y-containing, high-Mo Fe-based amorphous metal) as the parent material, with the addition of tungsten at 3 atomic percent. The repassivation potential for SAM8 in this aggressive environment (300-400 mV vs. Ag/AgCl) is substantially higher than that for Alloy C-22 (−100 mV vs. Ag/AgCl). The LDAR6 (SAM6) formulation has the same nominal elemental composition as the P-containing Fe-based amorphous metal formulation discussed in the literature by Pang et al. The repassivation potential for LDAR6 (SAME) in this aggressive environment (400 mV vs. Ag/AgCl) is substantially higher than that for Alloy C-22 (−100 mV vs. Ag/AgCl).

Figure 19:
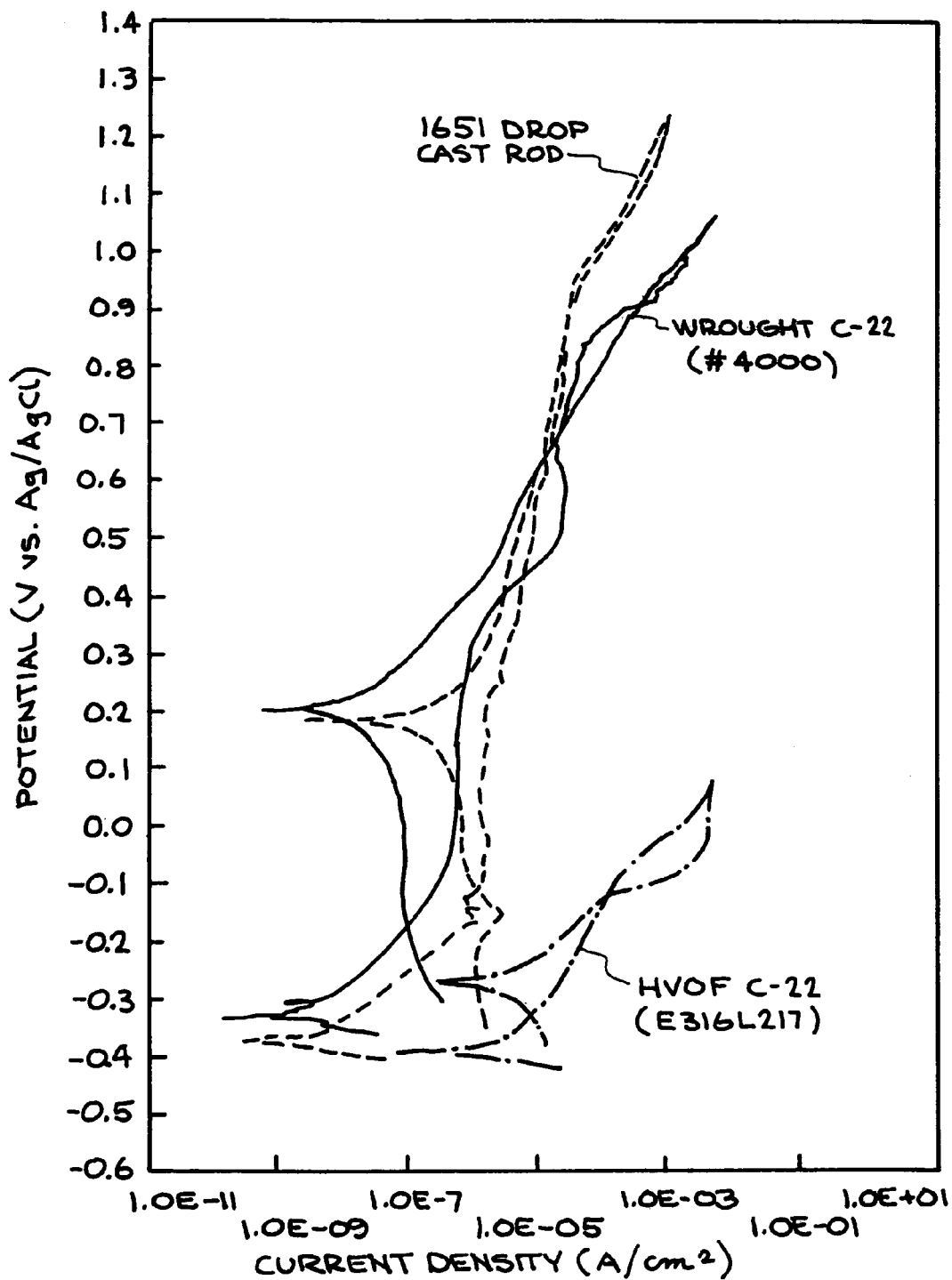
FIG. 19 comparison of the cyclic polarization curves for a SAM1651 (LDAR7 OR CBCTL1651) amorphous metal ingot, a sample of wrought nickel-based Alloy C-22, and a sample of thermally spray Alloy C-22 in ambient temperature, Half Moon Bay seawater is shown. The SAM1651 (LDAR7 OR CBCTL1651) amorphous metal had better corrosion resistance than both wrought and HVOF Alloy C-22.

Cyclic Polarization of Published SAM1651 (LDAR7 OR CBCTL1651) Composition (Joe Poon Alloy) in Seawater Environments Cyclic polarization testing of reference materials and Fe-based amorphous metals were conducted in Half Moon Bay seawater at various temperatures, ranging from 30 to 90° C., as well as in Key West seawater at ambient temperature. A comparison of the cyclic polarization curves for a SAM1651 (LDAR7 OR CBCTL1651) amorphous metal ingot, a sample of wrought nickel-based Alloy C-22, and a sample of thermal spray (HVOF) C-22 in ambient temperature Half Moon Bay seawater is shown in FIG. 19. FIG. 19 shows a comparison of the cyclic polarization curves for SAM1651 (LDAR7 OR CBCTL1651) amorphous metal ingot, a sample of wrought nickel-based Alloy C-22, and a sample of thermally spray Alloy C-22 in ambient temperature, Half Moon bay seawater is shown. The SAM1651 (LDAR7 OR CBCTL1651) amorphous metal had better corrosion resistance than both wrought and HVOF alloy C-22.

The curves for the SAM1651 (LDAR7 OR CBCTL1651) ingot and wrought Alloy C-22 have very small hysteresis loops, and repassivation potentials close to the potential required for oxygen evolution. It is therefore concluded that Y-containing Fe-based SAM1651 (LDAR7 OR CBCTL1651) amorphous metal performs very well in ambient temperature seawater, with performance comparable to wrought Alloy C-22. The data in this Figure-PVP also show that the corrosion resistance of Alloy C-22 is substantially degraded during the thermal spray process.

Figure 20:
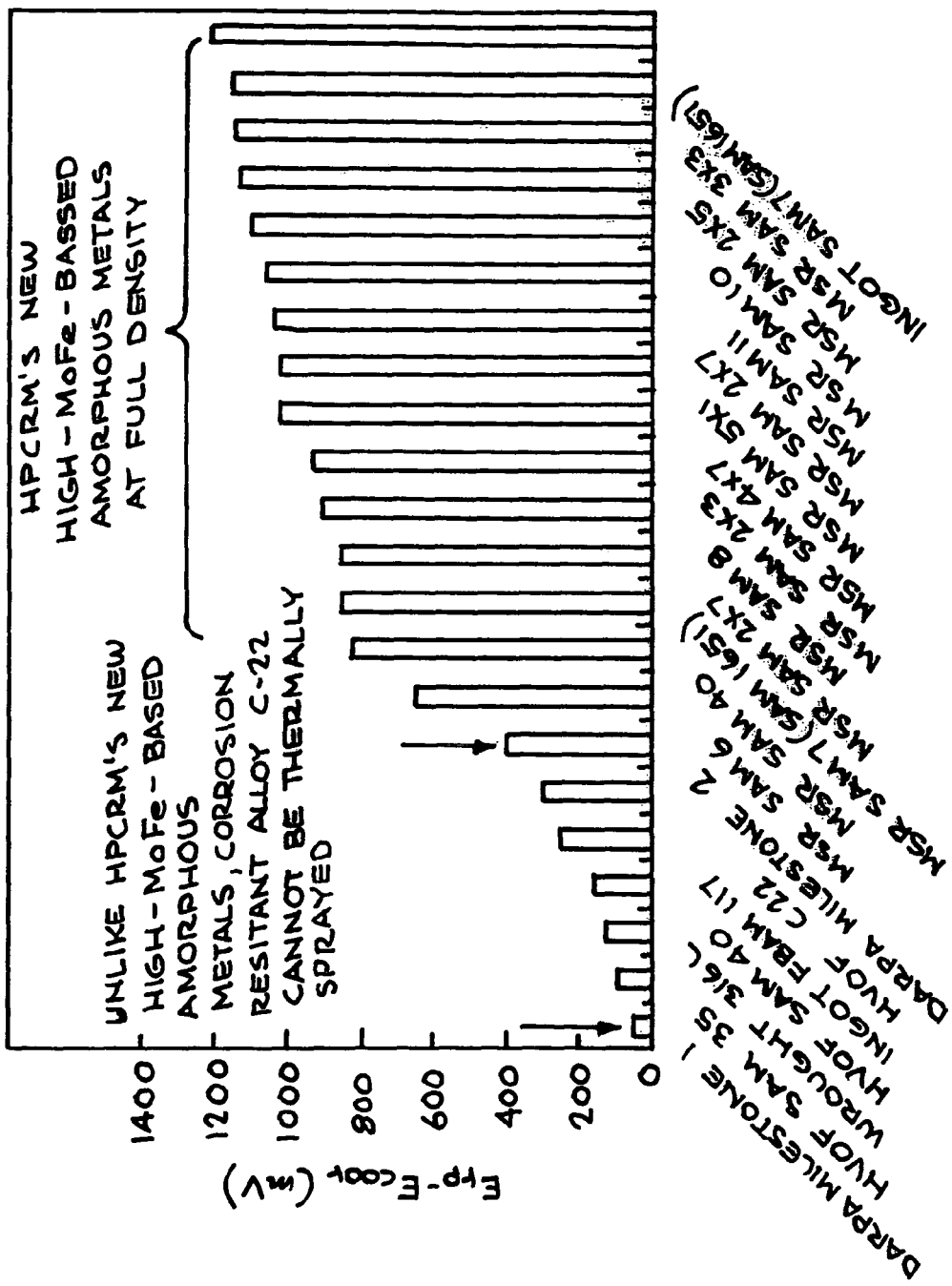
FIG. 20 various alloy samples, ranked based upon their measured resistance to localized corrosion ($\Delta E = E_{corr} - E_{rp}$) in Half Moon Bay seawater at 90° C. Most of the amorphous-samples performed very well, with the arc-melted drop-cast ingot of SAM1651 (LDAR7 OR CBCTL1651) showing the best performance. The electrochemical performance of these materials in seawater was as good as Alloy C-22, and superior to Type 316L stainless steel.

FIG. 20 shows a ranking of various alloy samples, based upon their measured resistance to localized corrosion ($\Delta E = E_{corr} - E_{rp}$) in Half Moon Bay seawater at 90° C. FIG. 20 shows various alloy samples, ranked based upon their measured resistance to localized corrosion ($\Delta E = E_{corr} - E_{rp}$) in Half Moon Bay seawater at 90° C. Most of the amorphous-samples performed very well, with the arc-melted drop-cast ingot of SAM1651 (LDAR7 OR CBCTL1651) showing the best performance. The electrochemical performance of these materials in seawater was as good as Alloy C-22, and superior to Type 316L stainless steel. Reference samples of Type 316L stainless steel do not perform as well in this environment as ingots and melt-spun ribbons of Fe-based amorphous metals. Most of the amorphous-samples performed very well, with the arc-melted drop-cast ingot of LDAR7 SAM1651 (LDAR7 OR CBCTL1651) and other Y-containing variants of the parent material (LDAR3X3 or SAM3X3) showing the best performance. The Mo-containing variants also showed outstanding performance. The previously published P-containing material performed well, but not as well as the Y- and Mo-containing variants of SAM40 (DAR40).

Electrochemical Corrosion Testing of Metallic Glasses with Critical Levels of Yttrium and Tungsten Ingots and melt-spun ribbons of the Y- and Mo-containing Fe-based amorphous metals have no grain boundaries, and therefore have more corrosion resistance in than the more expensive nickel-based Alloy C-22. While the passive film on nickel-based C-22 undergoes breakdown in 5M $CaCl_2$ at 105° C. at low potential, the passive film on the new Fe-based amorphous metal remains stable at a potential above that required for oxygen evolution. Electrochemical tests have proven that corrosion performance superior to wrought and thermally sprayed coatings of nickel-based Alloy C-22 can be achieved with the new iron-based amorphous metals. For example, the passive film on wrought Alloy C-22 undergoes breakdown at 100 to 200 mV vs. Ag/AgCl in 5M $CaCl_2$ at 105° C., whereas SAM1651 (LDAR7 OR CBCTL1651) maintains stable passivity, even as the potential is increased to levels approaching that required for oxygen evolution. These materials are far superior to thermal-spray coatings of Alloy C-22 in seawater. While it has not been possible to render Alloy C-22 as a corrosion resistant, thermal spray coating, such possibilities do exist with the amorphous metal formulations. The current Fe-based amorphous metals include specific elements known to impart corrosion and oxidation resistance, such as Cr, Mo, W. Additions of Y and Zr improve glass formability, while forming protective oxide scales at high temperature. In the future, the addition of titanium may also lead to improved passive film stability at higher temperatures, and is being explored.

Figure 21:
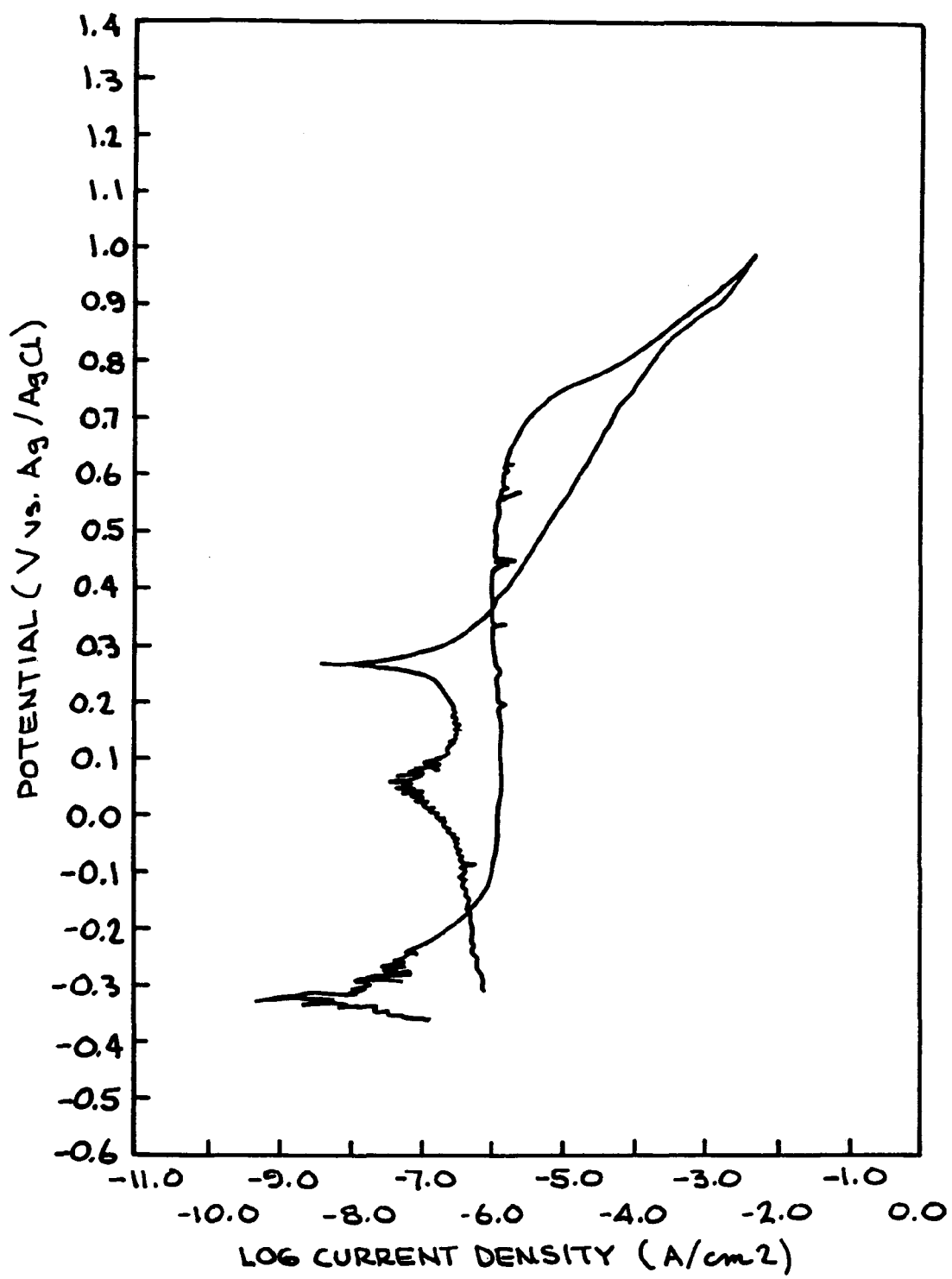
FIG. 21 cyclic polarization curve is for a melt-spun ribbon of LDAR8 in 5M CaCl2 at 105° C. The LDAR8 formulation uses SAM1651 (Y-containing, high-Mo Fe-based amorphous metal) as the parent material, with the addition of tungsten at 3 atomic percent. The repassivation potential for LDAR8 in this aggressive environment (300-400 mV vs. Ag/AgCl) is substantially higher than that for Alloy C-22 (–100 mV vs. Ag/AgCl).

This cyclic polarization curve for a melt-spun ribbon of LDAR8 in 5M $CaCl_2$ at 105° C. is shown in FIG. 21. FIG. 21 shows cyclic polarization curve is for a melt-spun ribbon of LDAR8 in 5M CaCl2 at 105° C. The LDAR8 formulation uses SAM1651 (LDAR7 OR CBCTL1651) (Y-containing, high-Mo Fe-based amorphous metal) as the parent material, with the addition of tungsten at 3 atomic percent. The repassivation potential for LDAR8 in this aggressive environment (300-400 mV vs. Ag/AgCl) is substantially higher than that for Alloy C-22 (−100 mV vs. Ag/AgCl). The LDAR8 formulation uses SAM1651 (LDAR7 OR CBCTL1651) (Y-containing, high-Mo Fe-based amorphous metal) as the parent material, with the addition of tungsten at 3 atomic percent. The repassivation potential for LDAR8 in this aggressive environment (300-400 mV vs. Ag/AgCl) is substantially higher than that for Alloy C-22 (−100 mV vs. Ag/AgCl).

Cyclic polarization testing of reference materials and Fe-based amorphous metals were conducted in hot, concentrated, calcium chloride solution. Unless otherwise stated, conducted in 5M $CaCl_2$ at 105° C. A compilation of the measured values of the open circuit corrosion potential ($E_{corr}$), the potential coinciding with the anodic oxidation peak ($E_{peak}$) the repassivation potential ($E_{rp}$), and the penetration rate based upon the maximum passive current density (dx/dt) is given in Table 3.

TABLE 3

Various Alloys at 105 Degrees Centigrade - No Nitrate

| Material | $E_{corr}$ mV (Ag/AgCl) | $E_{rp}$ mV (Ag/AgCl) | $E_{rp} - E_{corr}$ mV | dx/dt cm/yr |
| --- | --- | --- | --- | --- |
| LDAR1X7 | −396 | −321 | 75 | 7.31E−04 |
| LDAR6 (Inoue) | 125 | 407 | 282 | 2.31E−03 |
| Alloy C-22 | −482 | −110 | 372 | 1.06E−02 |
| LDAR2X3 | −327 | 363 | 690 | 2.31E−03 |
| LDAR8 | −327 | 363 | 690 | 2.91E−03 |
| LDAR2X7 | −109 | 671 | 780 | 7.31E−03 |
| LDAR2X5 | −301 | 546 | 847 | 1.84E−03 |
| LDAR2X7 | −178 | 677 | 855 | 4.61E−03 |
| LDAR2X3 | −151 | 713 | 864 | 4.61E−03 |
| LDAR7 (CBCTL1651) | −164 | 705 | 869 | 2.91E−01 |
| LDAR10 (LMDAR4022) | −300 | 610 | 910 | 7.31E−03 |
| LDAR11 (LMDAR1922) | −323 | 622 | 945 | 2.31E−03 |
| LDAR3X1 | −281 | 666 | 947 | 4.61E−03 |
| LDAR5X1 | −352 | 601 | 953 | 9.21E−04 |
| LDAR2X5 | −408 | 548 | 956 | 1.84E−04 |
| LDAR1X3 | −409 | 579 | 988 | 1.46E−03 |
| LDAR3X3 | −339 | 692 | 1031 | 2.31E−03 |

Cyclic polarization testing of reference materials and Fe-based amorphous metals were conducted in Half Moon Bay seawater at various temperatures, ranging from 30 to 90° C., as well as in Key West seawater at ambient temperature. A compilation of the measured values of the open circuit corrosion potential ($E_{corr}$), the potential coinciding with the anodic oxidation peak ($E_{peak}$), the repassivation potential ($E_{rp}$), and the penetration rate based upon the maximum passive current density (dx/dt) is given in Table 4.

General Motors (GM) test cycle, GM9540P, was used in both tests. The performance of the test developmental amorphous metal samples was evaluated by qualitative comparison to baseline or reference samples. Four types of reference samples were included to establish baseline performance.

TABLE 4

| Material | Process | Composition | $E_{corr}$ (Ag/AgCl) | $E_{rp}$ (Ag/AgCl) | $E_{rp} - E_{corr}$ mV | dx/dt cm/yr |
|---|---|---|---|---|---|---|
| Seawater at 30 Degrees Centigrade | | | | | | |
| DAR40 | HDIF | $Fe_{12.1}Mn_2Cr_{19}Mo_{2.5}W_{1.1}B_{15}C_4Si_{2.5}$ | −668 | −645 | 23 | |
| CBAM83 | Arc-Melt Drop-Cast Ingot | Fe-Based | −165 | −92 | 73 | 4.61E−03 |
| DAR40 | MSR | $Fe_{52.3}Mn_2Cr_{11}Mo_{2.5}W_{1.7}B_{16}C_4Si_{2.5}$ | −275 | −126 | 149 | 1.84E−01 |
| 316L | Wrought | Fe—Cr—Mo | −227 | −227 | 190 | 3.67E−03 |
| C22 | HVOF | Fe—Cr—Mo | −392 | −127 | 265 | 1.84E−01 |
| LDAR2X5 | MSR | $(DAR40)_{95} + Mo_5$ | −19 | 894 | 913 | 9.21E−04 |
| DAR40 | HVOF | $Fe_{51.3}Mn_2Cr_{13}Mo_{2.5}W_{1.7}B_{16}C_4Si_{2.5}$ | −94 | 830 | 924 | 9.21E−02 |
| DAR35 | HVOF | $Fe_{51.3}Mn_2Cr_{13}Mo_3W_{1.5}B_{16}C_4Si_3$ | −248 | 720 | 968 | 1.16E−02 |
| LDAR6 (Inoue) | MSR | $Fe_{47}Cr_{14}Mo_{16}B_5C_{10}P_{10}$ | −160 | 884 | 1044 | 4.61E−04 |
| LDAR10 (LMDAR4022) | MSR | $Fe_{51.3}Cr_{21.4}Mo_{2.6}W_{1.8}B_{16.9}$ | −233 | 858 | 1091 | 2.31E−03 |
| LDAR1X7 | MSR | $(DAR40)_{93} + Ni_7$ | −353 | 815 | 1168 | 1.84E−03 |
| LDAR5X1 | MSR | $(DAR40)_{99} + Zr_1$ | −275 | 930 | 1205 | 1.84E−03 |
| DAR40X3 | HVOF | $Fe_{50.7}Mn_{1.0}Cr_{11.4}Mo_{1.4}W_{1.6}B_{13.1}C_{1.9}Si_{2.4}$ | −370 | 878 | 1248 | 4.61E−01 |
| CBCTL1651 | Arc-Melt Drop-Cast Ingot | $Fe_{41}Mo_{14}Cr_{13}Y_2C_{13}B_6$ | −376 | 881 | 1257 | 4.61E−02 |
| LDAR1X3 | MSR | $(DAR40)_{97} + Ni_3$ | −310 | 972 | 1282 | 1.16E−03 |
| LDAR7 (CBCTL1651) | MSR | $Fe_{41}Mo_{14}Cr_{13}Y_2C_{13}B_6$ | −384 | 908 | 1292 | 9.21E−04 |
| Seawater at 60 Degrees Centigrade | | | | | | |
| 3161 | Wrought | Fe—Cr—Mo | −241 | −241 | 122 | 7.31E−03 |
| C22 | HVOF | Fe—Cr—Mo | −415 | −222 | 193 | 7.31E−01 |
| DAR40 | HVOF | $Fe_{52.3}Mn_2Cr_{13}Mo_{2.5}W_{1.7}B_{16}C_4Si_{2.5}$ | −362 | 750 | 1112 | 2.31E−01 |
| DAR35 | HVOF | $Fe_{54.5}Mn_3Cr_{13}Mo_2W_{0.5}B_{16}C_4Si_3$ | −360 | 752 | 1112 | 7.31E−02 |
| DAR40 | MSR | $Fe_{52.3}Mn_2Cr_{13}Mo_{2.5}W_{1.3}B_{16}C_4Si_{2.5}$ | −274 | 822 | 1096 | 1.84E−03 |
| Seawater at 90 Degrees Centigrade | | | | | | |
| DAR35 | HVOF | $Fe_{54.3}Mn_2Cr_{13}Mo_2W_{1.5}B_{16}C_4Si_3$ | −505 | −409 | 96 | |
| 316L | Wrought | Fe—Cr—Mo | −210 | none | 130 | 1.84E−02 |
| DAR40 | HVOF | $Fe_{52.3}Mn_2Cr_{10}Mo_{2.1}W_{1.7}B_{16}C_4Si_{2.5}$ | −504 | −346 | 155 | 7.31E−02 |
| FBAM117 | Arc-Melt Drop-Cast Ingot | Fe-Based | 336 | 591 | 255 | 9.21E−03 |
| C22 | HVOF | Fe—Cr—Mo | −576 | −277 | 299 | 1.46E−00 |
| LDAR6 (Inoue) | MSR | $Fe_{41}Cr_{14}Mo_{10}B_1C_{10}P_{10}$ | −97 | 560 | 657 | 2.31E−03 |
| DAR40 | MSR | $Fe_{52.3}Mn_2Cr_{13}Mo_{2.5}W_{1.7}B_{16}C_4Si_{2.5}$ | −115 | 716 | 831 | 2.91E−03 |
| LDAR7 (CBCTL1651) | MSR | $Fe_{41}Mo_{14}Cr_{15}Y_2C_{11}B_4$ | −313 | 543 | 856 | 3.67E−03 |
| LDAR2X7 | MSR | $(DAR40)_{97} + Mo_3$ | −182 | 680 | 862 | 1.84E−03 |
| LDAR8 | MSR | $(CBCTL1651)97 + W3$ | −355 | 553 | 908 | 4.61E−03 |
| LDAR2X3 | MSR | $(DAR40)_{97} + Mo_3$ | −241 | 693 | 934 | 2.91E−03 |
| LDAR4X7 | MSR | $(DAR40)_{93} + Ti_7$ | −21 | 1000 | 1021 | 4.61E−03 |
| LDAR5X1 | MSR | $(DAR40)_{99} + Zr_1$ | −198 | 823 | 1021 | 3.67E−03 |
| LDAR2X7 | MSR | $(DAR40)_{97} + Mo_3$ | −234 | 805 | 1039 | 3.67E−03 |
| LDAR11 (LMDAR1922) | MSR | DAR40 Variant | −287 | 771 | 1058 | 3.67E−03 |
| LDAR10 (LMDAR4022) | MSR | $Fe_{53.6}Cr_{21.4}Mo_{20}W_{1.6}B_{16.5}$ | −296 | 807 | 1103 | 5.81E−03 |
| LDAR4X5 | MSR | $(DAR40)_{95} + Ti_5$ | −224 | 910 | 1134 | 3.67E−03 |
| LDAR2X5 | MSR | $(DAR40)_{95} + Mo_5$ | −203 | 949 | 1152 | 2.318-03 |
| LDAR3X3 | MSR | $(DAR40)_{97} + Y_3$ | −371 | 789 | 1160 | 1.84E−03 |
| CBCTL1651 | Arc-Melt Drop-Cast Ingot | $Fe_{48}Mo_{14}Cr_{13}Y_2C_{15}B_{10}$ | −270 | 944 | 1214 | 2.31E−01 |

Salt Fog Testing of Published SAM1651 (LDAR7 OR CBCTL1651)
Composition (Also known as the Joe Poon Alloy)

The salt fog test was used to compare various wrought ant thermal-spray alloys, melt-spun ribbons, arc-melted drop-cast ingots, and thermal-spray coatings for their susceptibility to corrosion by salt sprays, like those that might be encountered aboard naval ships (this test is also known as the "salt spray" test). The most recent tests have focused on refined, state-of-the-art Fe-based amorphous-metal formulations, in the form of arc-melted drop-cast ingots, melt-spun ribbons, and high-velocity oxy-fuel coatings with no significant porosity and near theoretical density. In contrast, the first tests focused on early thermal-spray coatings, which had residual porosity and crystalline structure, and lower resistance to corrosion.

Both salt fog tests were conducted according to ASTM B117 "Standard Test Method of Salt Spray (Fog) Testing." A These references include: Type 316L stainless steel, nickel-based Alloy C-22 (N06022), Ti Grade 7, and the 50:50 nickel-chromium binary.

During the initial phase of the project, coatings of Type 316L stainless steel, nickel-based Alloy C-22, SAM40 (DAR40), SAM40X3 (SAM40X3) were deposited on stainless steel substrates (Type 316L) with the high-velocity oxy-fuel (HVOF) process. During salt-fog testing, there was no significant rusting of the reference samples. Substantial rusting of early HVOF coatings of SAM40 (DAR40) and Type 316L stainless steel was observed after only 13 cycles. There may have also been some slight rust formation on the Alloy C-22 HVOF coating. The rusting of these early coatings is attributed to non-optimal elemental composition, residual porosity, and partial devitrification during the thermal-spray process.

Figure 22A:
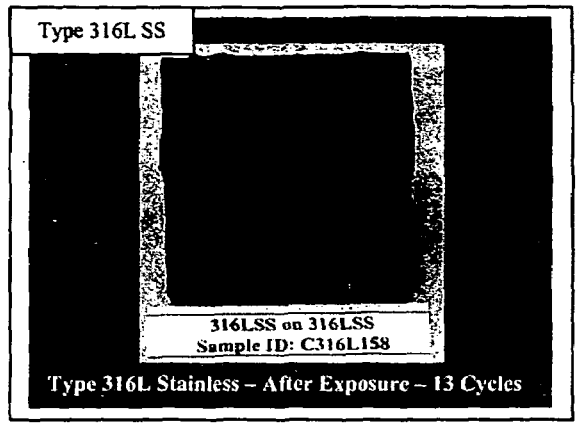
FIGS. 22A, 22B, and 22C are early thermal-spray coatings of Type 316L stainless steel and the SAM40 (DAR40) parent material showed relatively severe corrosive attack after only 13 cycles in the ASTM B117 salt fog test. However, several of the new Fe-based amorphous metal coatings, including SAM1651 (LDAR7 OR CBCTL1651) and SAM2X5 (LDAR2X5), have shown no corrosion, even after more than 30 cycles in this aggressive environment. It is therefore believed that these new materials will provide substantial benefit in some Naval applications.
Figure 22B:
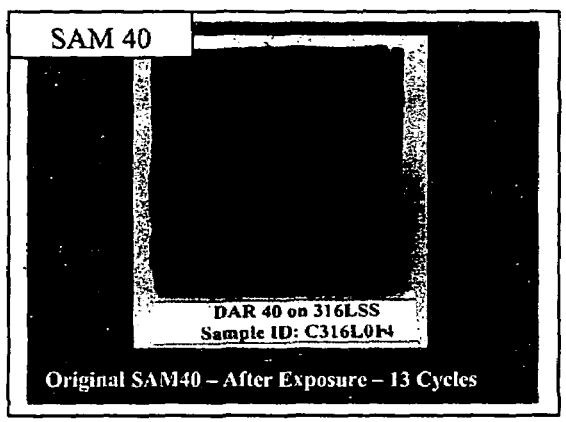
Figure 22C:
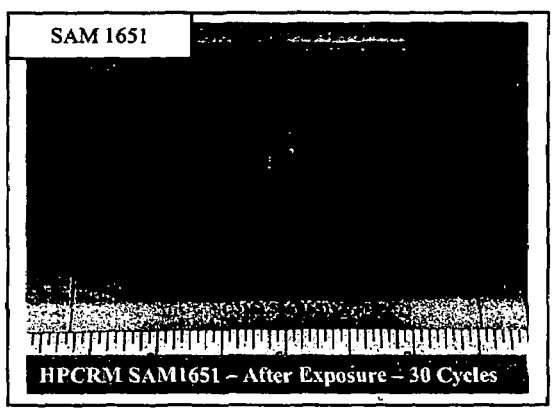
Figure 22D:
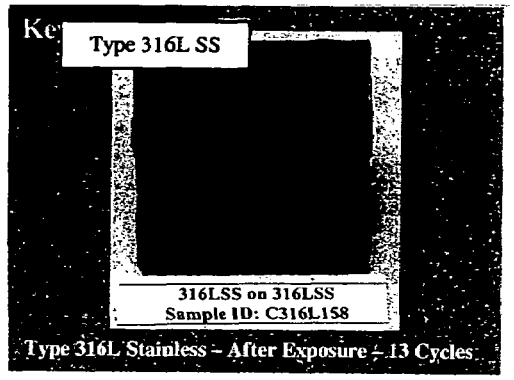
FIGS. 22D, 22E, 22F, and 22G are early thermal-spray coatings of Type 316L stainless steel and the SAM40 (DAR40) parent material showed relatively severe corrosive attack after only 13 cycles in the ASTM B117 salt fog test. However, several of the new Fe-based amorphous metal coatings, including SAM1651 (LDAR7 OR CBCTL1651) and SAM2X5 (LDAR2X5), have shown no corrosion, even after more than 30 cycles in this aggressive environment. It is therefore believed that these new materials will provide substantial benefit in some Naval applications.
Figure 22E:
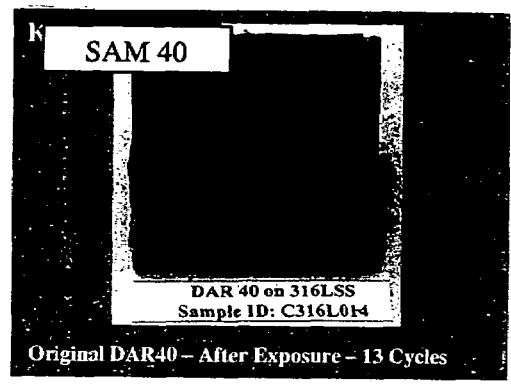
Figure 22F:
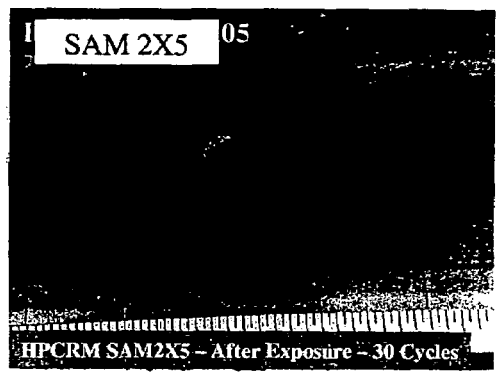
Figure 22G:
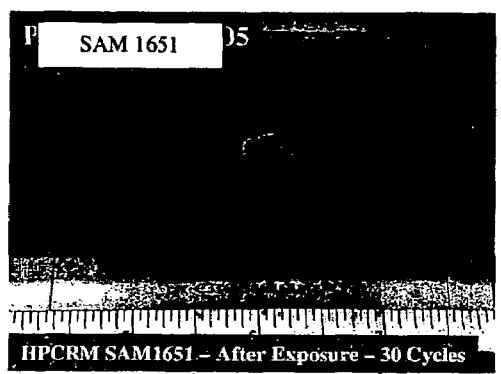

During the past year, several advanced formulations of Fe-based corrosion-resistant amorphous-metals have been produced. Some of these materials have lower critical cooling rates than the early SAM40 (DAR40) parent material, and may therefore be more easily deposited in a glassy state, and have optimized elemental compositions that exhibit much more stable passive film stability. As illustrated by FIGS. 22A, 22B and 22C, early thermal-spray coatings of Type 316L stainless steel and the SAM40 (DAR40) parent material showed relatively severe corrosive attack after only 13 cycles in the ASTM B117 salt fog test. FIGS. 22A, 22B and 22C show early thermal-spray coatings of Type 316L stainless steel and the SAM40 (DAR40) parent material showed relatively severe corrosive attack after only 13 cycles in the ASTM B117 salt fog test. However, several of the new Fe-based amorphous metal coatings, including SAM1651 (LDAR7 OR CBCTL1651) and SAM2X5 (LDAR2X5), have shown no corrosion, even after more than 30 cycles in this aggressive environment. It is therefore believed that these new materials will provide substantial benefit in some Naval applications. However, several of the new Fe-based amorphous metal coatings, including LFST7, SAM1651 (LDAR7 OR CBCTL1651) and SAM2X5 (LDAR2X5), have shown no corrosion, even after more than 30 cycles in this aggressive environment. It is therefore believed that these new materials will provide substantial benefit in some Naval applications. FIGS. 22D, 22E, 22F, and 22G show early thermal-spray coatings of Type 316L stainless steel and the SAM40 (DAR40) parent material showed relatively severe corrosive attack after only 13 cycles in the ASTM B117 salt fog test. However, several of the new Fe-based amorphous metal coatings, including SAM1651 (LDAR7 OR CBCTL1651) and SAM2X5 (LDAR2X5), have shown no corrosion, even after more than 30 cycles in this aggressive environment. It is therefore believed that these new materials will provide substantial benefit in some Naval applications.

Early HVOF coatings of DAR35, SAM40 (DAR40) and SAM40X3 (SAM35, SAM40 (DAR40) and SAM40X3) had non-optimal elemental compositions, and were produced with non-optimal thermal spray parameters (powder size, gun pressure, and particle velocity), and exhibited light rusting after 13 cycles in the classic salt fog test. However, additional work with optimized elemental compositions of these Fe-based amorphous metals, and samples in the form of fully dense pore-free materials, has shown no corrosion after 24 cycles in this aggressive test. The most promising formulations at the present time are believed to be SAM2X5 (LDAR2X5) and SAM1651 (LDAR7 OR CBCTL1651). Salt-fog testing of HVOF coatings of these materials showed no corrosion after more than 30 cycles in the salt fog test. Such performance cannot be achieved with thermally sprayed Type 316L stainless steel, as this material loses most of its desirable corrosion-resistance during the thermal spray process. To a lesser extent, similar difficulties are encountered during the thermal spraying of Alloy C-22.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. An apparatus, comprising:
a deposition chamber,
an amorphous metal deposition system in said deposition chamber that produces two amorphous metal deposition sprays, a first amorphous metal deposition spray and a second amorphous metal deposition spray,
said first amorphous metal deposition spray and said second amorphous metal deposition spray in said deposition chamber being corrosion-resistant amorphous metal deposition material that contains manganese (1 to 3 atomic %), yttrium (0.1 to 10 atomic %), and silicon (0.3 to 3.1 atomic %) in the range of composition given in parentheses; and that contains the following elements in the specified range of composition given in parentheses:
chromium (15 to 20 atomic %),
molybdenum (2 to 15 atomic %),
tungsten (1 to 3 atomic %),
boron (5 to 16 atomic %),
carbon (3 to 16 atomic %), and
the balance iron;
said first amorphous metal deposition spray and said second amorphous metal deposition spray producing a composite amorphous metal material made of corrosion-resistant amorphous metal that contains manganese (1 to 3 atomic %), yttrium (0.1 to 10 atomic %), and silicon (0.3 to 3.1 atomic %) in the range of composition given in parentheses; and that contains the following elements in the specified range of composition given in parentheses:
chromium (15 to 20 atomic %),
molybdenum (2 to 15 atomic %),
tungsten (1 to 3 atomic %),
boron (5 to 16 atomic %),
carbon (3 to 16 atomic %), and
the balance iron; and
wherein said amorphous metal deposition system in said deposition chamber directs said first amorphous metal deposition spray and said second amorphous metal deposition spray onto metal armor or projectiles or gun barrels or tank loader trays or rail guns or non-magnetic hulls or hatches or seals or propellers or rudders or pump impellers and shafts or containers for spent nuclear fuel or pressurized water reactors or boiling water reactors or breeder reactors with liquid metal coolant, said amorphous metal deposition system directing a
first layer and a second layer of corrosion-resistant amorphous-metal coating on said metal armor or projectiles or gun barrels or tank loader trays or rail guns or non-magnetic hulls or hatches or seals or propellers or rudders or pump impellers and shafts or containers for spent nuclear fuel or pressurized water reactors or boiling water reactors or breeder reactors with liquid metal coolant, wherein said corrosion-resistant amorphous-metal coating is made of amorphous metal that contains manganese (1 to 3 atomic %), yttrium (0.1 to 10 atomic %), and silicon (0.3 to 3.1 atomic %) in the range of composition given in parentheses; and that contains the following elements in the specified range of composition given in parentheses:
chromium (15 to 20 atomic %),
molybdenum (2 to 15 atomic %),
tungsten (1 to 3 atomic %),
boron (5 to 16 atomic %),
carbon (3 to 16 atomic %), and
the balance iron, wherein said first amorphous metal deposition spray and said second amorphous metal deposition spray have different compositions and wherein said first layer and said second layer having different compositions direct a graded corrosion-resistant amorphous-metal coating on said metal armor or projectiles or gun barrels or tank loader trays or rail guns or non-magnetic hulls or hatches or seals or propellers or rudders or pump impellers and shafts or containers for spent nuclear fuel or pressurized water reactors or boiling water reactors or breeder reactors with liquid metal coolant.

2. An apparatus for producing a corrosion resistant amorphous metal coating on a structure to be coated including metal armor or projectiles or gun barrels or tank loader trays or rail guns or non-magnetic hulls or hatches or seals or propellers or rudders or pump impellers and shafts or containers for spent nuclear fuel or pump impellers and shafts or containers for spent nuclear fuel or pressurized water reactors or boiling water reactors or breeder reactors with liquid metal coolant, comprising:

a deposition chamber with the structure to be coated in said deposition chamber, an amorphous metal deposition system in said deposition chamber that produces two amorphous metal deposition sprays, a first amorphous metal deposition spray and a second amorphous metal deposition spray, said amorphous metal deposition system including a magnetron and a sputter target, said first amorphous metal deposition spray and said second amorphous metal deposition spray being made of a amorphous metal deposition material that is corrosion-resistant amorphous metal deposition material that contains manganese (1 to 3 atomic %), yttrium (0.1 to 10 atomic %), and silicon (0.3 to 3.1 atomic %) in the range of composition given in parentheses; and that contains the following elements in the specified range of composition given in parentheses:

chromium (15 to 20 atomic %),
molybdenum (2 to 15 atomic %),
tungsten (1 to 3 atomic %),
boron (5 to 16 atomic %),
carbon (3 to 16 atomic %), and
the balance iron;

said first amorphous metal deposition spray and said second amorphous metal deposition spray producing a composite amorphous metal material made of corrosion-resistant amorphous metal that contains manganese (1 to 3 atomic %), yttrium (0.1 to 10 atomic %), and silicon (0.3 to 3.1 atomic %) in the range of composition given in parentheses; and that contains the following elements in the specified range of composition given in parentheses:

chromium (15 to 20 atomic %),
molybdenum (2 to 15 atomic %),
tungsten (1 to 3 atomic %),
boron (5 to 16 atomic %),
carbon (3 to 16 atomic %), and
the balance iron; and wherein said amorphous metal deposition system in said deposition chamber directs said first amorphous metal deposition spray and said second amorphous metal deposition spray onto the structure to be coated including metal minor or projectiles or gun barrels or tank loader trays or rail guns or non-magnetic hulls or hatches or seals or propellers or rudders or pump impellers and shafts or containers for spent nuclear fuel or pump impellers and shafts or containers for spent nuclear fuel or pressurized water reactors or boiling water reactors or breeder reactors with liquid metal coolant, said amorphous metal deposition system directing a first layer and a second layer of corrosion-resistant amorphous-metal coating on the structure to be coated including metal armor or projectiles or gun barrels or tank loader trays or rail guns or non-magnetic hulls or hatches or seals or propellers or rudders or pump impellers and shafts or containers for spent nuclear fuel or pressurized water reactors or boiling water reactors or breeder reactors with liquid metal coolant, wherein said corrosion-resistant amorphous-metal coating is made of amorphous metal that contains manganese (1 to 3 atomic %), yttrium (0.1 to 10 atomic %), and silicon (0.3 to 3.1 atomic %) in the range of composition given in parentheses; and that contains the following elements in the specified range of composition given in parentheses:

chromium (15 to 20 atomic %),
molybdenum (2 to 15 atomic %),
tungsten (1 to 3 atomic %),
boron (5 to 16 atomic %),
carbon (3 to 16 atomic %), and
the balance iron, wherein said first amorphous metal deposition spray and said second amorphous metal deposition spray have different compositions and wherein said first layer and said second layer having different compositions direct a graded corrosion-resistant amorphous-metal coating on the structure to be coated including metal armor or projectiles or gun barrels or tank loader trays or rail guns or non-magnetic hulls or hatches or seals or propellers or rudders or pump impellers and shafts or containers for spent nuclear fuel or pressurized water reactors or boiling water reactors or breeder reactors with liquid metal coolant.

* * * * *